(12) United States Patent
Beaudin et al.

(10) Patent No.: US 10,056,875 B1
(45) Date of Patent: Aug. 21, 2018

(54) RADIO FREQUENCY FRONT END TRANSMIT AND RECEIVE PATH SWITCH GAIN

(71) Applicant: QUALCOMM Incorporated, San Diego, CA (US)

(72) Inventors: Steve Andre Beaudin, Los Gatos, CA (US); Moshe Meir, Sunnyvale, CA (US); Ramakrishna Sekhar Narayanaswami, Palo Alto, CA (US); Eyal Hochdorf, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/630,529

(22) Filed: Jun. 22, 2017

Related U.S. Application Data

(60) Provisional application No. 62/454,666, filed on Feb. 3, 2017.

(51) Int. Cl.

| | |
|---|---|
| *H04B 1/04* | (2006.01) |
| *H03G 3/30* | (2006.01) |
| *H04W 52/02* | (2009.01) |
| *H03F 1/02* | (2006.01) |
| *H04B 1/38* | (2015.01) |

(Continued)

(52) U.S. Cl.
CPC ......... *H03G 3/3042* (2013.01); *H03F 1/0244* (2013.01); *H03F 1/0261* (2013.01); *H03F 3/19* (2013.01); *H03F 3/245* (2013.01); *H04B 1/38* (2013.01); *H04W 52/0251* (2013.01); *H04W 52/0261* (2013.01)

(58) Field of Classification Search
CPC ... H03G 3/3042; H03F 1/0244; H03F 1/0261; H03F 3/19; H03F 3/245; H04B 1/38; H04W 52/0251; H04W 52/0261
USPC ...................................... 455/114.3
See application file for complete search history.

(56) References Cited

U.S. PATENT DOCUMENTS

| | | |
|---|---|---|
| 4,929,855 A | 5/1990 | Ezzeddine |
| 7,711,070 B2 | 5/2010 | Weissman et al. |

(Continued)

OTHER PUBLICATIONS

Horiguchi K., et al., "Three-Mode Stage-bypass High-Efficiency Power Amplifiers for Wideband Code Division Multiple Access (W-CDMA) Applications," Mitsubishi Electric Corporation, 2012, pp. 2-4.

(Continued)

*Primary Examiner* — Sanh Phu
(74) *Attorney, Agent, or Firm* — Qualcomm Incorporated/Seyfarth Shaw LLP; Alan M. Lenkin

(57) ABSTRACT

A radio frequency front end of a user equipment for reducing power consumption includes a receive chain having a first low noise amplifier stage, a transmit chain including a first power amplifier stage, a transmit bypass path, a receive bypass path and a time division duplex switch. The transmit bypass path is selectively coupled to a transmit signal path at a first intermediate point of the transmit chain, prior to the first power amplifier stage. The receive bypass path is selectively coupled to a receive signal path at a first intermediate point of the receive chain after the first low noise amplifier stage. The time division duplex switch is selectively coupled to an antenna, the transmit bypass path, the receive bypass path, the first power amplifier stage and the first low noise amplifier stage.

18 Claims, 16 Drawing Sheets

(51) Int. Cl.
*H03F 3/19* (2006.01)
*H03F 3/24* (2006.01)

(56) References Cited

U.S. PATENT DOCUMENTS

| | | | |
|---|---|---|---|
| 8,229,370 B2* | 7/2012 | Wu | H04W 52/52 |
| | | | 455/115.1 |
| 8,331,289 B1* | 12/2012 | Lee | H04B 1/006 |
| | | | 370/328 |
| 2007/0018720 A1 | 1/2007 | Wright | |
| 2007/0262817 A1 | 11/2007 | Ciccarelli et al. | |
| 2009/0081979 A1 | 3/2009 | Wilhelm et al. | |
| 2010/0329165 A1* | 12/2010 | Matsuura | H04W 52/0264 |
| | | | 370/311 |
| 2016/0227603 A1 | 8/2016 | Huang et al. | |
| 2016/0276983 A1 | 9/2016 | Vaillancourt et al. | |
| 2016/0308551 A1 | 10/2016 | Talty et al. | |

OTHER PUBLICATIONS

Partial International Search Report—PCT/US2018/012415—ISA/EPO—dated Apr. 12, 2018.
Yao J., et al., "1.5-2.7 GHz Ultra Low Noise Bypass LNA," IEEE MTT-S International Microwave Symposium (IMS), 2014, 3 Pages.

* cited by examiner

RADIO FREQUENCY FRONT END TRANSMIT AND RECEIVE PATH SWITCH GAIN

CROSS-REFERENCE TO RELATED APPLICATIONS

The present application claims the benefit of U.S. Provisional Patent Application No. 62/454,666, filed on Feb. 3, 2017, and titled "RADIO FREQUENCY FRONT END TRANSMIT AND RECEIVE PATH SWITCH GAIN," the disclosure of which is expressly incorporated by reference herein in its entirety.

TECHNICAL FIELD

The present disclosure generally relates to tuning devices. More specifically, aspects of the present disclosure relate to a radio frequency front end configuration of a user equipment to achieve switch gain in transmit and receive paths while enhancing power amplifier efficiency and noise figure.

BACKGROUND

A wireless system operates under a large dynamic range of conditions. For example, the wireless system may be subject to a path loss as low as 30-40 decibels (dB) when a client device (e.g., handset, wireless device or user equipment) and a station (e.g., base station) are in close proximity and/or experience a path loss, which can exceed 150 dB for large cells, when the client device is at an extreme edge of coverage.

To operate with this large dynamic range, a receive chain and transmit chain of the client device are designed to support a large range of receive and transmit gains. Given that the base station or access point serves many client devices, the base station transmits downlink signals at a constant power (e.g., close to the base station's maximum power) to ensure that packets transmitted by the base station reach the furthest client devices. Accordingly, the burden falls upon the handset or client device to adjust its receiver gain. When the client device is close to the base station and the receive signal strength is large, the client device reduces the receiver gain and increases the linearity of the receiver to prevent an overload condition. When the client device moves away from the base station and a signal strength of a received signal from the base station drops, the wireless device increases its receiver gain to maintain an adequate signal to noise ratio. Ideally, the ability to dynamically adjust the receiver gain should not compromise a desired noise figure of the receiver because a small noise figure is a key performance parameter when operating near the cell edge.

Regarding uplink, the base station receives packets from multiple client devices simultaneously. In some systems (e.g., orthogonal frequency division multiple access (OFDMA) based systems such as Long Term Evolution (LTE) or 802.11ax), uplink signals from multiple client devices may be transmitted towards the base station simultaneously, in a same time slot, by using different resource blocks or subcarriers. To ensure that a receiver of the base station is not subject to an excessively large dynamic range, transmit power of the multiple client devices are controlled by a feedback loop. The feedback loop provides control to the respective signals of the client devices so that the respective signals arrive at the base station receiver within a desired range of a received signal strength indication (RSSI).

When a received signal strength indication of a client device at the base station receiver is above or below a target received signal strength indication, the client device receives a request to either decrease or increase its transmit power. The request may be received based on a transmit power control loop. It is therefore desirable for a transmit chain of a client device or a customer premise equipment (CPE) to adjust the transmit power over a large range.

SUMMARY

In an aspect of the present disclosure, a radio frequency front end of a user equipment includes a receive chain, a transmit chain, a transmit bypass path, a receive bypass path and a time division duplex switch. The receive chain includes a first low noise amplifier stage and the transmit chain includes a first power amplifier stage. The transmit bypass path is selectively coupled to a transmit signal path at a first intermediate point of the transmit chain, prior to the first power amplifier stage. The receive bypass path is selectively coupled to a receive signal path at a first intermediate point of the receive chain after the first low noise amplifier stage. The time division duplex switch is coupled to an antenna, the transmit bypass path, the receive bypass path, the first power amplifier stage and the first low noise amplifier stage.

In another aspect of the present disclosure, a radio frequency front end of a user equipment includes a receive chain, a transmit chain, a transmit signal path coupling means, a receive signal path coupling means and a time division duplex switch. The receive chain includes a first low noise amplifier stage and the transmit chain includes a first power amplifier stage. The transmit signal path coupling means is selectively coupled to a transmit signal path at a first intermediate point of the transmit chain, prior to the first power amplifier stage. The receive signal path coupling means is selectively coupled to a receive signal path at a first intermediate point of the receive chain after the first low noise amplifier stage. The time division duplex switch is coupled to an antenna, the transmit signal path coupling means, the receive signal path coupling means, the first power amplifier stage and the first low noise amplifier stage.

Another aspect of the present disclosure includes a method of bypassing a low noise amplifier stage and a power amplifier stage of a radio frequency front end of a user equipment. The method dynamically switches a time division duplex (TDD) switch to bypass one or more low noise amplifier stages or one or more power amplifier stages. The TDD switch is selectively coupled to an antenna, a transmit bypass path, a receive bypass path, the one or more power amplifier stages and the one or more low noise amplifier stages. The method also includes bypassing the one or more power amplifier stages via the transmit bypass path coupling a transmit signal path at an intermediate point prior to a final stage of the one or more power amplifier stages when the user equipment operates in a reduced transmit power mode. The method further includes bypassing the one or more low noise amplifier stages via the receive bypass path coupling a receive signal path at an intermediate point after a first stage of the one or more low noise amplifier stages when the user equipment operates in a low receive gain mode.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
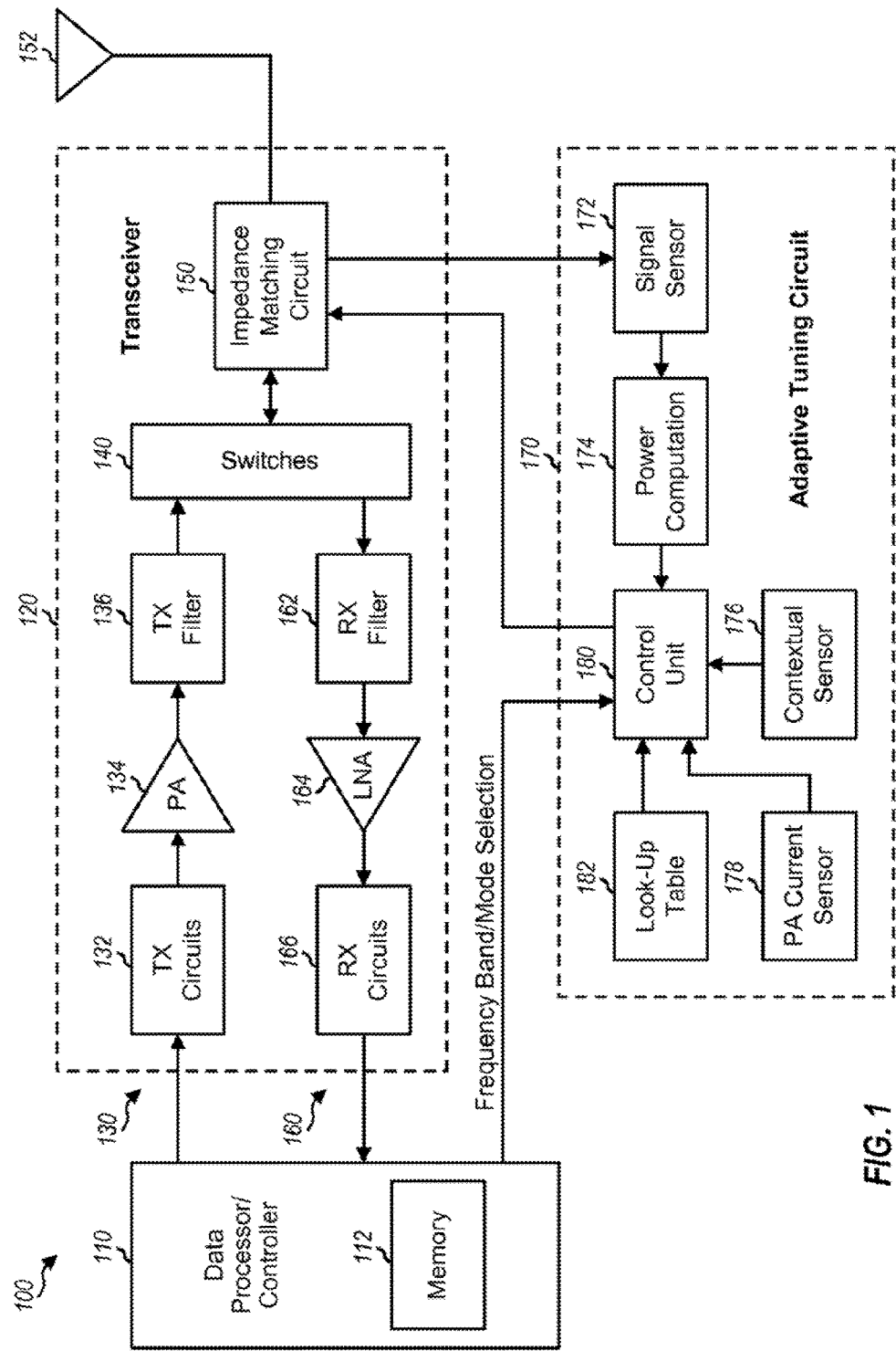
FIG. 1 illustrates a wireless device in accordance with an exemplary aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR" and the use of the term "or" is intended to represent an "exclusive OR".

Aspects of the present disclosure are directed to reducing power consumption of a power amplifier (PA) when a user equipment (UE) or customer premises equipment (CPE) is operating according to a reduced power mode. Similarly, power consumption should be reduced when the user equipment or CPE is receiving high signals (e.g., above a predefined threshold value) from a base station. The ability to vary transmit power of a transmit chain should be accomplished without sacrificing the maximum transmit power that the device can deliver, especially when the user equipment is operating on a cell edge. For example, when the user equipment is requested to transmit at a reduced power, the power reduction should be achieved such that the DC power consumption of the user equipment is reduced to improve battery life.

To achieve an improved system performance and link budget, when the user equipment or CPE is near the cell edge, a transmit chain should deliver large radio frequency power. For example, the transmit chain should deliver as large a radio frequency power as practical to the antenna, while meeting communication specifications (or regulatory mask) and providing a sufficiently low distortion (e.g., error vector magnitude (EVM)) to support a desired modulation. The receive chain should amplify the signal with as low a noise figure as possible, while introducing sufficiently low distortion.

In certain situations, the PA is bypassed because the amplification by the PA may create a signal that interferes with other signals due to the strength of the signal. Such situations may occur if the communication device is close to an access point or a base station. In other situations, the PA is bypassed to conserve battery power.

In some user equipments, the PA, the low noise amplifier LNA and a time division duplex switch are either in a radio frequency integrated circuit (RFIC) or a system on chip (SOC) for highly integrated systems. In other implementations the power amplifier (PA), the low noise amplifier (LNA) and the time division duplex (TDD) switch are incorporated in a Front End Module (FEM) for higher performance devices. One way to bypass an amplifier (e.g., LNA) is to implement a bypass circuit or switch within the amplifier circuit. For example, the bypass switch is included in the LNA circuit in a receive path or chain. This implementation achieves a slight increase in noise figure because the incorporation of a bypass switch on the LNA die includes components to be inserted prior to the LNA in the receive chain. The impact of the inclusion of the components prior to the LNA on noise figure is in the range of 0.25-0.5 dB, which is very costly.

For systems that do not include LNA bypass capability, a first low noise amplifier stage may limit a maximum third order intercept point (IP3) of the receiver when it is operating in low receive gain mode. This is due to the fact that the first low noise amplifier stage is optimized to provide the best possible noise figure, and an acceptable level of linearity when the client is operating near the cell edge. Designing the first low noise amplifier stage to have a higher linearity results in a slight degradation to the noise figure, and also an increase in direct current (DC) power consumption. Accordingly, an LNA with bypass capability is desirable relative to systems that do not include bypass capability.

A low gain state may be implemented in the transmit chain by shutting off one of two final stage transistors in the PA, which achieves a 50% reduction in current consumption for the final PA stage. However, this implementation results in a significant reduction (e.g., about a quarter (¼)) of the available radio frequency power because the output of the PA is poorly matched.

Aspects of the present disclosure incorporate one extra pole in a time division duplex (TDD) switch, to implement both the LNA bypass, and final stage PA bypass. This aspect of the disclosure achieves bypass without adding any extra components or without being subjected to loss between the TDD switch and the LNA in the receive path, or the PA and TDD switch in the transmit path. Accordingly, impact due to either receive noise figure, or maximum transmit power is reduced or eliminated. Aspects of the present disclosure improve or reduce receive noise figure (e.g., to ~0.25–0.5 dB) relative to implementations with a switchable LNA. In addition, third order intercept (IP3) in a receive path or chain when operating in bypass mode is improved because a gate of the LNA is not exposed to the radio frequency path.

Further, aspects of the present disclosure mitigate some drawbacks of a switchable LNA. For example, one drawback of a switchable LNA is that the switch only provides ~10 to 15 dB of isolation between the radio frequency path and the gate of the LNA, which limits the IP3 in the bypass mode. The present disclosure avoids exposing the LNA to the radio frequency path in the bypass mode to improve IP3. For example, the LNA is behind the TDD switch and is not exposed to the radio frequency path when in the bypass mode.

For the transmit path, the present disclosure separates or completely removes the final PA stage from the transmit path. This feature reduces power consumption of the multi-stage PA by ~90% when maximum or increased transmit power is not specified because only a pre-driver and driver are powered on. When full transmit power is specified, there is no impact to performance because no components are added between the PA and the TDD switch to implement the bypass mode.

Another aspect of the present disclosure is directed to the TDD switch. The TDD switch may include a single pole three throw switch (also referred to as a single pole triple throw switch) where a third throw, which is used for bypass, uses field effect transistors (FETs) with a smaller gate width for the bypass path. RF switch design is subject to a careful compromise between using a large gate width to reduce drain to source resistance (Rds) of the FET in the on state and the desire to keep parasitic capacitance of the FETs small while reversed biased. The reduction in the drain to source resistance reduces or minimizes insertion loss. A reduction in the parasitic capacitance reduces or minimizes loading on the radio frequency signal path being used.

In a main transmit path, the FETs (e.g., series FETs) are specified to have a sufficiently large gate width to keep the drain to source resistance sufficiently low to reduce power loss as well as handle the high radio frequency power. In the main LNA path, the drain to source resistance of the series FETs are sufficiently small to reduce insertion loss to avoid adversely impacting the noise figure. Accordingly, FETs with a suitably large gate width are specified. For the additional throw, which is introduced to implement the bypass function, a first series FET that branches off from the antenna port uses a smaller gate width to minimize or reduce capacitive loading on the main receive or transmit paths when they are in use. In one aspect, the bypass path is used when signal power (e.g., received signal strength indicator (RSSI) is high and noise figure is not critical, or when the device transmits at a reduced power where small losses in the bypass path are acceptable. By designing the TDD switch to use a bypass FET with a small gate width, capacitive loading by this transistor is reduced with little or no impact to the main transmit and receive paths.

Figure 12:
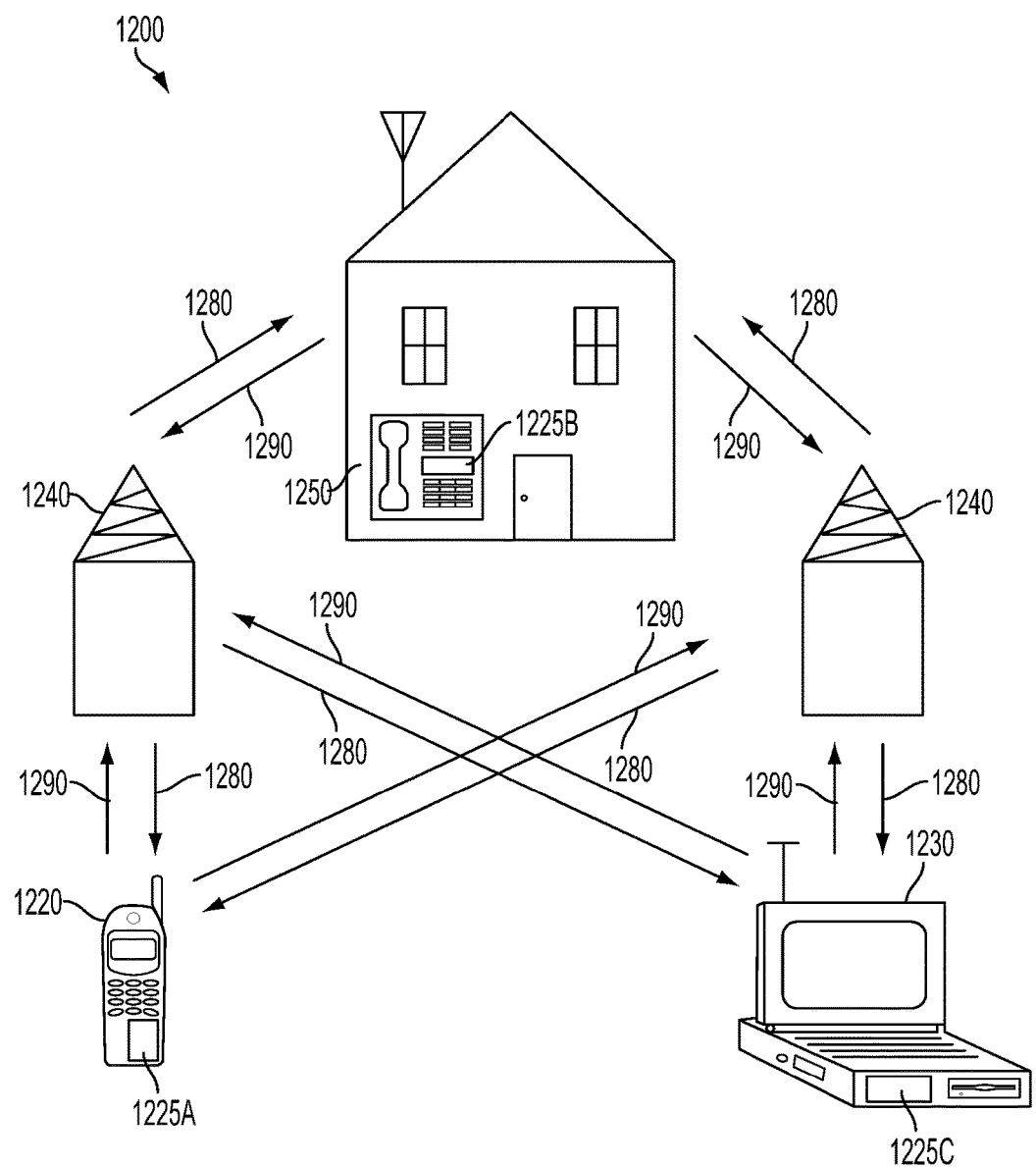
FIG. 12 is a block diagram showing an exemplary wireless communication system in which a configuration of the disclosure may be advantageously employed.

The concepts of the present disclosure may be implemented in a wireless device of FIG. 1 and the wireless communication system of FIG. 12.

FIG. 1 illustrates a wireless device 100 in accordance with an exemplary aspect of the present disclosure. The wireless device 100 includes a data processor/controller 110, a transceiver 120, an adaptive tuning circuit 170, and an antenna 152. The transceiver 120 includes a transmitter 130 and a receiver 160 that support bi-directional wireless communication. The wireless device 100 may support Long Term Evolution (LTE), Code Division Multiple Access (CDMA) 1× or cdma2000, Wideband CDMA (WCDMA), Global System for Mobile Communications (GSM), IEEE 802.11, 5th generation mobile networks (5G), etc.

In the transmit path, the data processor 110 processes (e.g., encodes and modulates) data to be transmitted and provides an analog output signal to the transmitter 130. Within the transmitter 130, the transmit (TX) circuits 132 amplify, filter, and upconvert the analog output signal from baseband to RF and provide a modulated signal. The TX circuits 132 may include amplifiers, filters, mixers, an oscillator, a local oscillator (LO) generator, a phase locked loop (PLL), etc. A power amplifier (PA) 134 receives and amplifies the modulated signal and provides an amplified RF signal having the proper output power level. A TX filter 136 filters the amplified RF signal to pass signal components in a transmit band and attenuate signal components in a receive band. The TX filter 136 provides an output RF signal, which is routed through switches 140 and an impedance matching circuit 150 and transmitted via the antenna 152. The impedance matching circuit 150 performs impedance matching for the antenna 152 and is also referred to as an antenna tuning circuit, a tunable matching circuit, etc.

In the receive path, the antenna 152 receives signals from base stations and/or other transmitter stations and provides a received RF signal, which is routed through the impedance matching circuit 150 and the switches 140 and provided to the receiver 160. Within the receiver 160, a receive (RX) filter 162 filters the received RF signal to pass signal components in the receive band and attenuate signal components in the transmit band. An LNA 164 amplifies a filtered RF signal from the RX filter 162 and provides an input RF signal. RX circuits 166 amplify, filter, and downconvert the input RF signal from RF to baseband and provide an analog input signal to the data processor 110. The RX circuits 166 may include amplifiers, filters, mixers, an oscillator, an LO generator, a PLL, etc.

The adaptive tuning circuit 170 tunes or adjusts the impedance matching circuit 150 such that good performance can be achieved for data transmission and reception. Within the adaptive tuning circuit 170, a sensor 172 receives input signals from the impedance matching circuit 150 and measures the voltage, current, power, and/or other characteristics of the input signals. A computation unit 174 receives the measurements from the sensor 172 and determines the delivered power and/or the impedance of the load observed by the impedance matching circuit 150, which is the antenna 152 in FIG. 1. A control unit 180 receives the delivered power and/or impedance from the computation unit 174. The control unit 180 may also receive the outputs of contextual sensors 176, PA current from a PA current sensor 178, and a control signal indicative of a selected frequency band/channel and/or a selected mode from the processor 110. The control unit 180 may also receive performance characterizations for different possible settings of the impedance matching circuit 150 from a look-up table 182. The control unit 180 generates a control signal to tune the impedance matching circuit 150 to achieve good performance, e.g., to obtain higher delivered power to the load.

In some aspects, the adaptive tuning circuit 170 may also include fewer, different and/or other sensors. The computation unit 174 may be separate from the control unit 180 (as shown in FIG. 1) or may be part of control unit 180. All or part of the adaptive tuning circuit 170 may be implemented digitally. For example, the computation unit 174 and the control unit 180 may be implemented by the data processor/controller 110. The look-up table 182 may be stored in the memory 112 or some other memory.

All or a portion of the transceiver 120 and the adaptive tuning circuit 170 may be implemented on one or more analog integrated circuits (ICs), RF ICs (RFICs), mixed-signal ICs, etc. The PA 134 and possibly other circuits may be implemented on a separate IC or module. The impedance matching circuit 150 and possibly other circuits may also be implemented on a separate IC or module.

The data processor/controller 110 may perform various functions for the wireless device 100. For example, the data processor 110 may perform processing for data being transmitted via the transmitter 130 and received via the receiver 160. The processor 110 may control the operation of the TX circuits 132, the RX circuits 166, the switches 140, and/or the adaptive tuning circuit 170. The memory 112 may store program codes and data for the data processor/controller 110. The memory 112 may be internal to the data processor/controller 110 (as shown in FIG. 1) or external to the data processor/controller 110 (not shown in FIG. 1). The data processor/controller 110 may be implemented on one or more application specific integrated circuits (ASICs) and/or other ICs.

Figure 2:
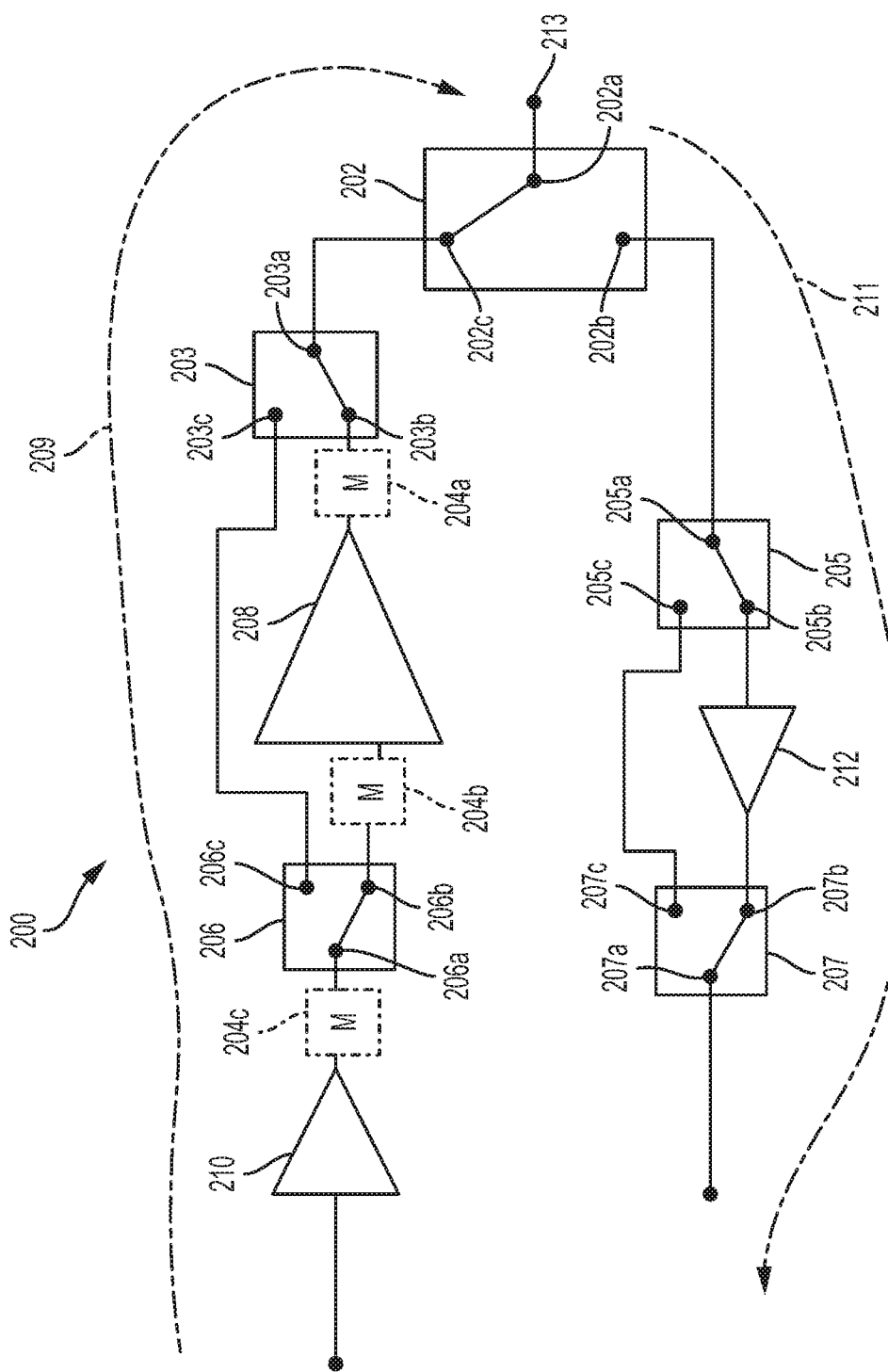
FIG. 2 illustrates an example of a power amplifier stage and a low noise amplifier stage with built in bypass.

FIG. 2 illustrates an example block diagram 200 of a power amplifier (PA) stage and a low noise amplifier (LNA) stage with built in bypass. The PA stage and the LNA stage may be part of a transceiver (e.g., transceiver 120) of a wireless device (e.g., wireless device 100). An antenna (not shown) may be coupled to a switch 202 (e.g., a TDD switch) via an antenna port 213. The switch 202 may be a single pole double throw switch that is selectively coupled to a transmit signal path 209 and a receive signal path 211. Thus, the switch 202 switches between a transmit signal path 209 and a receive signal path 211. For example, the switch 202 includes a pole 202a coupled to the antenna port 213 and the pole 202a is selectively coupled to a first throw 202b and a second throw 202c, which are respectively coupled to the receive signal path 211 and the transmit signal path 209.

For example, the first throw 202b of the switch 202 is coupled to a pole 205a of a first bypass switch 205 of the receive signal path 211. The pole 205a of the first bypass switch 205 may be selectively coupled to a first throw 205b or a second throw 205c of the first bypass switch 205. The second throw 202c of the switch 202 is coupled to a pole 203a of a second bypass switch 203 of the transmit signal path 209. The pole 203a of the second bypass switch 203 may be selectively coupled to a first throw 203b or a second throw 203c of the second bypass switch 203.

The switch 202 selects the receive signal path 211 when the wireless device is receiving a signal. The received signal is propagated from the switch 202 through a first bypass switch 205 to a low noise amplifier (LNA) 212 when the first throw 205b of the first bypass switch 205 is selected. The received signal is propagated from the switch 202 through a first bypass switch 205 to a third bypass switch 207 to bypass the LNA 212 when the second throw 205c of the first bypass switch 205 is selected. The third bypass switch 207 may be a single pole double throw switch. The third bypass switch 207 is selectively coupled to the LNA 212 and the first bypass switch 205. For example, a first throw 207b of the third bypass switch 207 is selected to couple the third bypass switch 207 to the LNA 212. A second throw 207c of the third bypass switch 207 is selected to couple the third bypass switch 207 to the first bypass switch 205 to bypass the LNA 212. An output of the third bypass switch may be provided to a radio frequency (RF) receiver (e.g., RX circuits 166) and subsequently to a data processor/controller (e.g., data process/controller 110).

The LNA may be bypassed for strong received signal strength indication (RSSI) levels, where good linearity is preferred over low noise figure. However, the disadvantage of an LNA with built in bypass is that the noise figure introduced by the first bypass switch 205 in the receive signal path 211 is larger (e.g., ~0.5 dB) relative to an LNA without a built in bypass.

When the wireless device transmits a signal, the switch 202 switches to the transmit signal path 209 that includes the second switch 203. The second switch 203 works in conjunction with a fourth bypass switch 206 to bypass a PA 208 when the wireless device is transmitting a signal from an RF transmitter (e.g., TX circuits 132) the signal is received by the fourth bypass switch 206 via a driver amplifier 210 and an impedance matching circuit 204c. The fourth bypass switch 206 is selectively coupled to the PA 208 via an impedance matching circuit 204b and selectively coupled to the second bypass switch 203.

The fourth bypass switch 206 may be a single pole double throw switch. A pole 206a of the fourth bypass switch 206 may be selectively coupled to a first throw 206b and a second throw 206c of the fourth bypass switch 206. For example, the second throw 206c of the fourth bypass switch 206 is coupled to the second throw 203c of the second bypass switch 203 to bypass the PA 208. The first throw 206b of the fourth bypass switch 206 is coupled to the PA 208 to provide the transmitted signal to the PA 208 for signal amplification. The first throw 203b of the second bypass switch 203 is selected to propagate the amplified transmitted signal through an impedance matching circuit 204a, the second bypass switch 203, and the switch 202 to an antenna for wireless transmission.

There are many instances of variable gain PAs where a driver or pre-driver are switched in and out to vary an overall PA gain. However, the final stage (e.g., PA) of the transmit/receive chain is usually not by-passable to ensure that the final stage achieves the highest 1-dB compression (P1 dB) point and power added efficiency (PAE) when maximum power is specified. Adding a switch (e.g., second bypass switch 203) in front of the PA in the transmit signal path 209, however, degrades the 1 dB compression measurement (P1 dB) by 0.5 dB, and the PAE by ~10% as a result of additional insertion loss after the output of the power amplifier.

Accordingly, development of a switchable LNA and/or a switchable PA incorporated in an overall front end module (FEM), as illustrated in FIGS. 3-10, is desirable.

Figure 3:
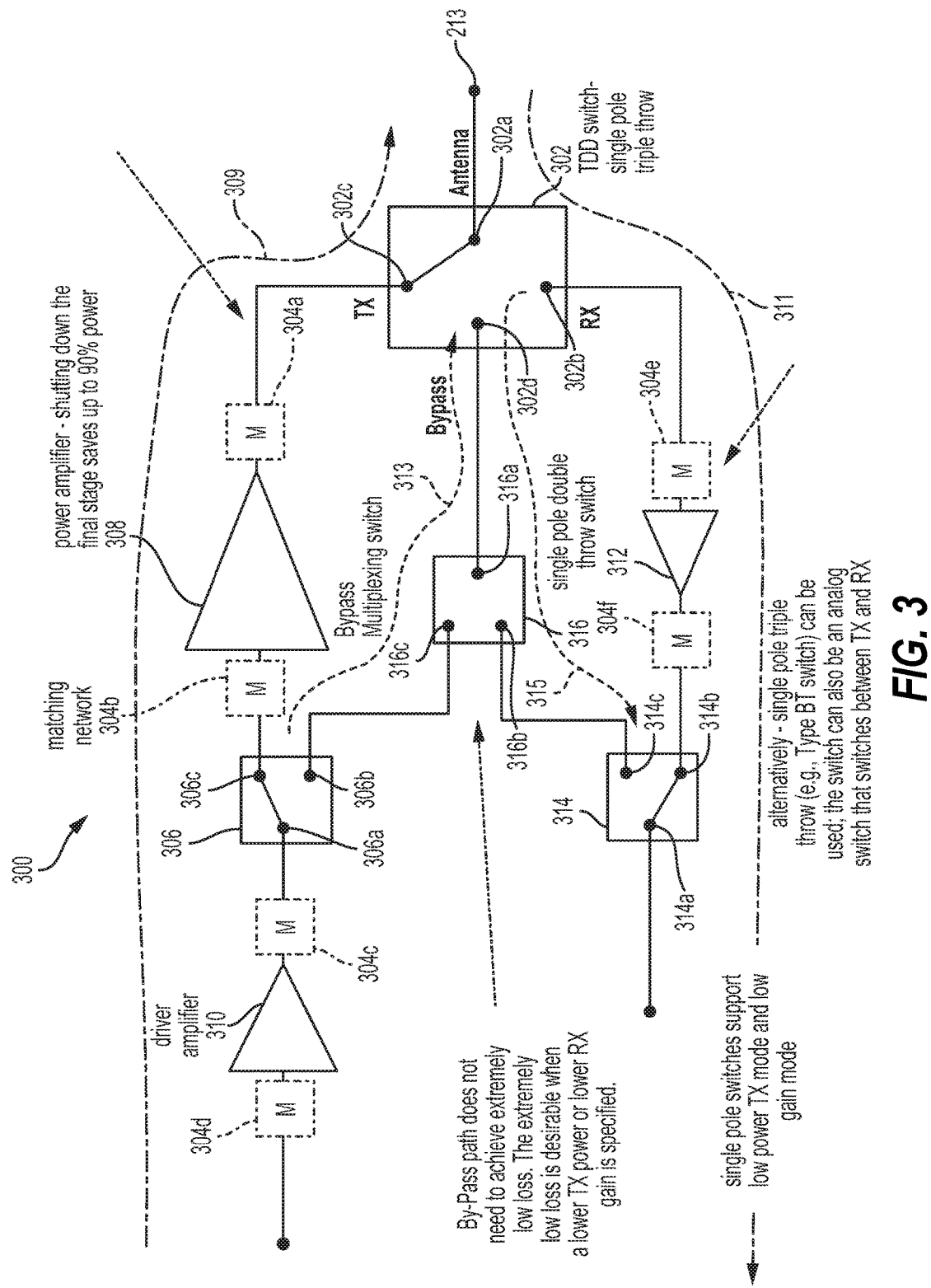
FIG. 3 illustrates an example of a switchable low noise amplifier stage and a switchable power amplifier stage according to aspects of the present disclosure.

FIG. 3 illustrates an example block diagram 300 of a switchable low noise amplifier (LNA) stage and a switchable power amplifier (PA) stage according to aspects of the present disclosure. For illustrative purposes, some of the labelling and numbering of the components and features of FIG. 3 are similar to those of FIG. 2.

The block diagram 300 includes a receive signal path 311 (that traverses a receive chain) and a transmit signal path 309. The receive signal path 311 is separate and independent of the transmit signal path 309. Thus, transmit signals may be propagated (e.g., from the data processor/controller 110) through a different communication path than the communication path through which the receive signals are propagated to the data processor/controller 110. While a first bypass switch 205 of FIG. 2 is positioned between the LNA 212 and the switch 202, the block diagram 300 of FIG. 3 does not include a bypass switch in the receive signal path 311 between an LNA 312 and a switch 302 (e.g., TDD switch). Improved or optimal noise figure performance is achieved by removing the first bypass switch 205 from the input of the LNA 312.

In addition, unlike the block diagram of FIG. 2, the block diagram 300 of FIG. 3 does not include a bypass switch in the transmit signal path 309 between a PA 308 and the switch 302 (e.g., TDD switch). This means that at a final stage or final output stage (e.g., PA) of the transmit signal path 309 (that traverses a transmit chain) no switches are included. As a result, loss between the output of the PA 308 (at the final stage) and the switch 302 is reduced.

The switch 302 may be a single pole triple throw switch that is selectively coupled to the transmit signal path 309, the receive signal path 311 and a bypass path. The bypass path may be a first transmit bypass path 313 or a first receive bypass path 315. Thus, the switch 302 switches between the transmit signal path 309, the receive signal path 311 and the bypass path. For example, the switch 302 includes a pole 302a coupled to the antenna port 213. The pole 302a is further selectively coupled to a first throw 302b, a second throw 302c and a third throw 302d of the switch 302. Any other switching devices may be used in place of the switching devices described herein as long as the devices can selectively couple different portions of the transmit signal path 309 and/or the receive signal path 311 to achieve a bypass mode.

The receive signal path 311 includes an LNA stage that includes the LNA 312. Although FIG. 3 illustrates a single LNA stage including the single LNA 312, the LNA stage may include multiple LNAs and the receive signal path may include multiple LNA stages. One or more of the LNAs of the LNA stage may be bypassed to improve efficiency of the signal reception or to save power. The receive signal path 311 also includes impedance matching circuits 304e and 304f as well as a first bypass switch 314.

The transmit signal path 309 includes a PA stage, which includes one or more PAs and drivers for the one or more PAs. Although FIG. 3 illustrates a single PA stage including the single PA 308, the PA stage may include multiple PA drivers and/or pre-drivers. The transmit signal path 309 may include multiple PA stages. For example, the transmit signal path includes a PA 308 and a PA driver amplifier 310. The transmit signal path 309 further includes impedance matching circuits 304a, 304b, 304c, and 304d as well as a second bypass switch 306. One or more of the devices (e.g., the PA 308 and/or driver amplifier 310) in the power stage or one or more power stages may be bypassed to improve efficiency of the signal reception and/or to save power. For example, when a power stage is bypassed, power supply to one or more portions of the power stage (e.g., the PA 308) is reduced or cut off to save power.

For example, power consumption by some or all transistors of the final power stage may be cut off. The power consumption of individual transistors can be reduced or eliminated by controlling their individual base or gate bias voltage. The base or gate bias voltage is used to turn the transistor on/off or to adjust the transistor to a desirable bias condition. For example, the transistor may be adjusted to or from a more linear bias condition that uses more current to a less linear bias condition that uses less current. The transistor may also be shut off to eliminate current consumption all together.

In some implementations, shutting down the final output stage of the PA stage saves up to ninety percent (90%) of power consumed by the PA stage. The power savings is applicable to two or three stage power amplifiers where the final output stage (e.g., PA 308) has a P1 dB which is at least ten (10) dB greater than that of the driver 310 or pre-driver amplifier. For example, consider a transmitter where the final PA output stage has a 1 dB compression point of 32 dBm, with 12 dB of gain. To ensure that the compression occurs at the power amplifier final output stage of the PA 308 instead of the driver amplifier 310, the driver amplifier 310 would have a 1 dB compression of at least 32 dBm-12 dB gain of the final output stage, which amounts to a P1 dB=>20 dBm. Given that the final output stage 308 consumes more power, and is more expensive, the driver amplifier is designed to be slightly over sized to reduce its contribution to the overall EVM or out of band emissions budget.

In an example, the driver amplifier may have 2-3 dB of margin, and would have a P1 dB=32 dBm-12 dB gain of the final stage of the power amplifier stage plus a 3 dB margin=~23 dBm. A specific amount of margin allocated to the driver amplifier varies from one design to another. In general, the power consumption of a gain block is proportional to its P1 dB for a given bias condition or class of power amplifier. Generally, power amplifiers that are inherently more linear (e.g., a class A amplifier) may have a lower power added efficiency (PAE) and consume more DC power for a desired P1 dB.

The block diagram 300 further includes a bypass multiplexing switch 316 shared between the first transmit bypass path 313 and the first receive bypass path 315. The bypass multiplexing switch 316 selectively couples a first intermediate point of the transmit signal path 309 to the switch 302 to bypass the PA 308 (e.g., through the first transmit bypass path 313) during a transmit bypass mode. Similarly, the bypass multiplexing switch 316 selectively couples a first intermediate point of the receive signal path 311 to the switch 302 to bypass the LNA 312 (e.g., through the first receive bypass path 315) during a receive bypass mode.

The bypass multiplexing switch 316 may be a single pole double throw switch. A pole 316a of the bypass multiplexing switch 316 is coupled to the third throw 302d of the switch 302 such that transmit signals or receive signals are selectively propagated through the bypass multiplexing switch 316 and the switch 302 in a bypass mode instead of through the PA 308 or the LNA 312 in a non-bypass mode. The pole 316a is selectively coupled to the first throw 316b and the second throw 316c of the bypass multiplexing switch 316.

The first intermediate point of the transmit signal path 309 may be the second bypass switch 306 in the transmit signal path 309. The second bypass switch 306 may be a single pole double throw switch coupled to the transmit signal path 309 during the non-bypass mode and the first transmit bypass path 313 during the bypass mode. The second bypass switch 306 switches between the first transmit bypass path 313 and the transmit signal path 309. The second bypass switch 306 includes a pole 306a coupled to the impedance matching circuit 304c. The pole 306a is selectively coupled to a first throw 306b and a second throw 306c of the second bypass switch 306 for respectively coupling to the first transmit bypass path 313 and the transmit signal path 309. For example, the first throw 306b is coupled to the second throw 316c of the bypass multiplexing switch 316 and the second throw 306c is coupled to the impedance matching circuit 304b.

The first intermediate point of the receive signal path 311 may be the first bypass switch 314. The first bypass switch 314 may be a single pole double throw switch that is coupled to the receive signal path 311 during a non-bypass mode and coupled to the first receive bypass path 315 during the bypass mode. Thus, the first bypass switch 314 switches between the first receive bypass path 315 and the receive signal path 311. The first bypass switch 314 includes a pole 314a for coupling to the radio frequency circuit (RX circuits 166). The pole 314a is selectively coupled to a first throw 314b and a second throw 314c of the first bypass switch 314 for respectively coupling to the first receive bypass path 315 and the receive signal path 311 based on a desired bypass mode.

The switch 302 incorporates a bypass path (e.g., the first transmit bypass path 313 and the first receive bypass path 315) in addition to the transmit signal path 309 and the receive signal path 311 to implement a front end module (FEM). The FEM can bypass the main PA (e.g., the PA 308) or the main LNA (e.g., the LNA 312) with reduced or no performance loss to the transmit signal path 309 or the receive signal path 311. Extremely low loss may not be desirable for the bypass path for various transmit and/or receive power gain levels. However, the bypass path may be specified to achieve extremely low loss when a lower transmit power or lower receive power gain is specified. For example, one or more of the switches (e.g., the switch 302, the bypass multiplexing switch 316, the first bypass switch 314, and/or the second bypass switch 306) in the receive signal path 311, the transmit signal path 309, the first transmit bypass path 313 and/or the first receive bypass path 315 support low power transmit mode and low gain mode.

The following description illustrates power consumption at different points of the communication path (e.g., transmit signal path 309) that could potentially be saved when portions of the PA stage(s) or the LNA stage(s) are bypassed. Consider power consumption in a 2 GHz front end module (FEM).

TABLE 1

PA and Driver both used

| | Input | Driver Amplifier 304 Output | Power Amplifier final stage - 308 Output | Total Power Consumption |
|---|---|---|---|---|
| P1dB (dBm) | | 23 | 32 | |
| Gain (dB) | | 15 | 12 | |
| Prms (dBm) | −3 | 11 | 23 | |
| Backoff from P1dB | | 12 | 9 | |
| Efficiency | | 17.6% | 24.8% | |
| DC Power Consumption (mW) | | 72 | 803 | 875 |

TABLE 2

PA is Bypassed.

| | Input | Driver Amplifier 304 Output | Power Amplifier final stage - 308 Output | Total Power Consumption |
|---|---|---|---|---|
| P1dB (dBm) | | 23 | | |
| Gain (dB) | | 15 | | |
| Prms (dBm) | −6 | 14 | | |
| Backoff from P1dB | | 9 | | |
| Efficiency | | 24.8% | | |
| DC Power Consumption (mW) | | 101 | 0 | 101 |

Table 1 illustrates an example of P1 dB, RF power and DC power consumption that could be present in the power amplifier stage shown in FIG. 3. Table 1 illustrates a scenario where both the driver amplifier 310 and final power amplifier stage 308 are used. In this example, the final power amplifier stage 308 is designed to provide up to 23 dBm of root mean square (rms) power. For an orthogonal frequency division multiplex (OFDM) waveform, the peak to average power ratio (PAPR) is about 10 dB. Assuming a crest factor reduction is not used, the P1 dB of the final power amplifier stage 308 should be approximately 10 dB greater than the desired rms power. In this case, it is assumed that at a maximum power, the crests of the waveform are 1 dB into compression, and the P1 dB in this case is 9 dB above the rms power at the final power amplifier stage 308. Given that the crests of the waveform are compressed, the signal experiences some distortion, and the final stage of the final power amplifier stage 308 introduces some error vector magnitude (EVM) as well as raise out of band emissions (OOBE).

For the driver amplifier 310, the rms power is only 11 dBm. Given that the final power amplifier stage 308 has 12 dB of gain, if the driver amplifier 310 was also 1 dB into compression, the P1 dB of the driver amplifier 310 would only be 32 dBm-12 dB=20 dBm. However, because it is undesirable for the driver amplifier 310 to contribute appreciably to the EVM or OOBE budget, the P1 dB of the driver amplifier 310 is increased by 3 dB, to arrive at a P1 dB of 23 dBm for the driver amplifier 310.

Using a standard approximation for the efficiency of an ideal Class AB amplifier, efficiencies of 17.6% and 24.8% are respectively obtained for the driver amplifier 310 and final power amplifier stage 308, for the respective rms power (Prms) of 11 dBm and 23 dBm at the output of the driver amplifier 310. A corresponding direct current (DC) power consumption for the driver amplifier 310 and the final power amplifier stage 308 are respectively 72 mW and 804 mW. If both gain blocks are used in the transmit path 309, the two cascaded amplifiers consume a combined power of 875 mW. Use of both of the gain blocks allows the wireless device 100 to transmit at or near its maximum power, to ensure an uplink signal reaches a distant base station or access point.

Conversely, when the device is close to a cell site, or access point, maximum transmit power is not specified. In such a case, the wireless device 100 could shut down the final power amplifier stage 308 and only use the driver amplifier 310, in conjunction with the transmit bypass path 313. In this operating mode, the parameters of the wireless device 100 shown in Table 2 illustrate that the wireless device transmits a maximum power of 14 dBm, and the power amplifier consumption is reduced to 101 mW. When the final power amplifier stage 308 is no longer part of the signal path, the EVM and adjacent channel leakage ratio (ACLR) budget allocated to the power amplifier stage are now available for the driver amplifier 310, freeing up budgeted margins to deliver useful power. In this example, the ability to bypass the final power amplifier stage 308 reduces the power consumption by a factor of 8.7. The gain, P1 dB, and efficiency provided in this example are exemplary values, and it should be understood that the number of power settings could be increased, and the specific efficiency, gain and P1 dB of each gain block and setting are design variables that can be changed on a case by case basis. The column to the far right of the Tables show the total DC power consumption for the scenario where both the driver amplifier 310 and the final power amplifier stage 308 are used.

Some benefits of the implementation in FIG. 3, compared to that shown in FIG. 2, are that the insertion loss introduced by the RF switches between the output of the PA 308, and the antenna port 213, as well as from the antenna port 213 to the input of the LNA 312, are reduced. In FIG. 3, a single throw is added to the TDD switch 302 to implement both the transmit bypass as well as the receive bypass. Adding an additional throw to modify a single pole double throw (SPDT) switch into a single pole triple throw (SP3T) switch adds a reduced amount of insertion loss (e.g., only add 0.1 to 0.2 dB of insertion loss).

Conversely, including additional switches 205 prior to the LNA input, or switch 203 after the PA 208 output (as illustrated in FIG. 2), increases insertion loss considerably (e.g., adds approximately 0.5 dB or more of insertion loss in both the transmit and receive paths). This additional insertion loss would affect both the maximum TX power that the power amplifier can deliver to the antenna, as well as the minimum noise figure that the receiver can provide. Having both bypass paths, (or potentially additional bypass modes as will be shown later), share a common throw on the TDD switch 302, enables a switch gain transmitter or receiver to be implemented with little impact to both the transmitter as well as the receiver performance.

For the transmit chain, having less insertion loss between the power amplifier and the antenna allows the wireless device 100 to deliver more RF power to the antenna for a given DC power consumption and power amplifier P1 dB compression point. An additional 0.5 dB insertion loss reduces the DC power by about 10%, and the effective efficiency of the transmit chain is correspondingly reduced by 10% as well.

Figure 4A:
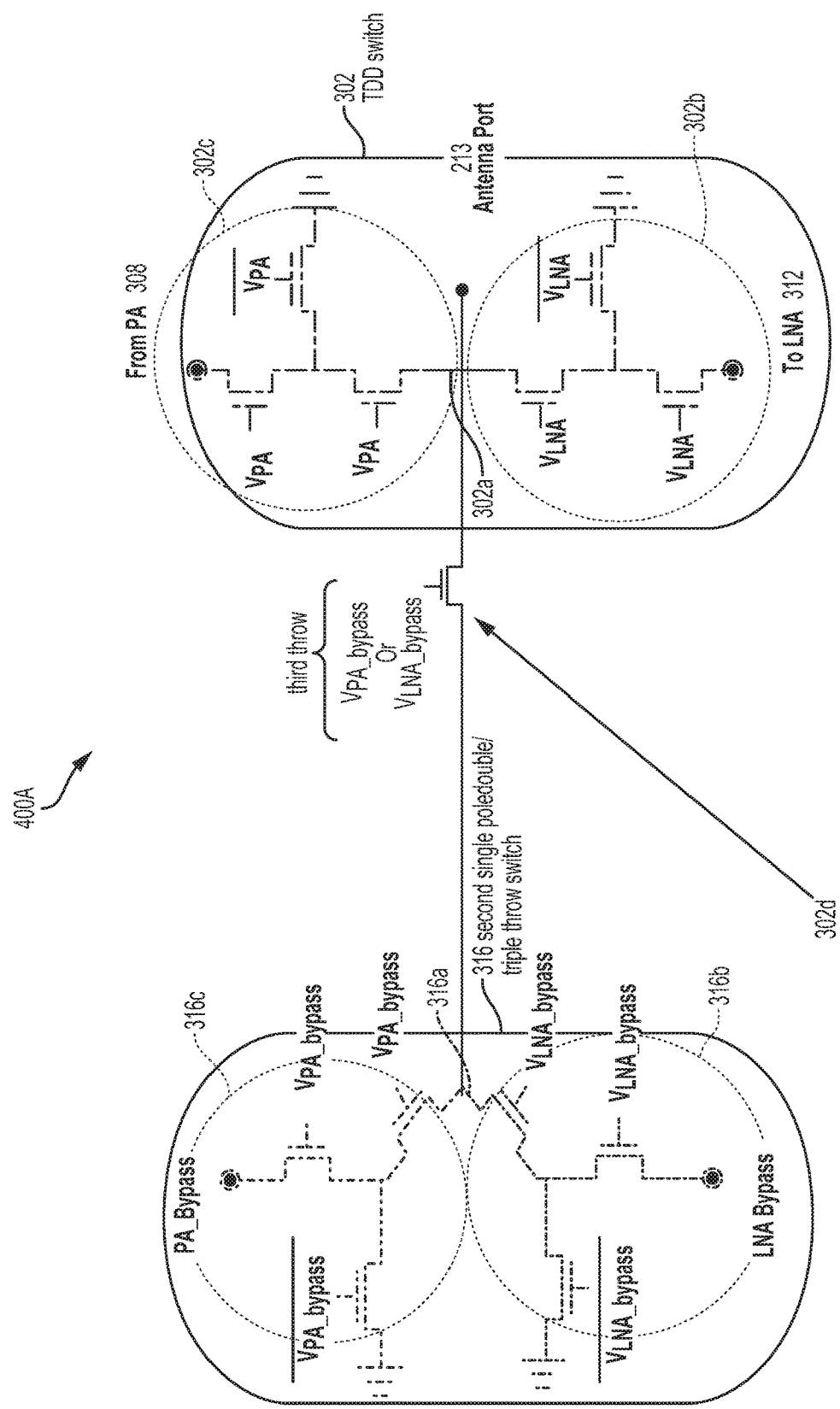
FIG. 4A illustrates an example of an asymmetrical switch with reduced gate width according to aspects of the present disclosure.

FIG. 4A illustrates an example of an asymmetrical switch 400A with reduced gate width according to aspects of the present disclosure. For illustrative purposes, some of the labelling and numbering of the components and features of FIG. 4A are similar to those of FIG. 3.

In one aspect of the disclosure, the asymmetrical switch may be the switch 302, which is coupled to the bypass multiplexing switch 316. FIG. 4A illustrates a circuit configuration of the switch 302 and the bypass multiplexing switch 316. A bypass branch of the switches use field effect transistors (FETs). In one aspect, at least one of the FETs in the bypass branch is a transistor with smaller gate width relative to other transistors of the switch 302. For example, the bypass branch of the switch 302 may be the third throw 302d. Thus, the gate width of the FET of the third throw 302d may be shorter relative to a gate width of the FETs of the first throw 302b and the FETs of the second throw 302c. In the off state (reverse biased), a FET with smaller gate width introduces a smaller capacitance to the antenna port. However, the FET has reduced or minimal impact on the main transmit (e.g., transmit signal path 309) or receive (e.g., receive signal path 311) paths.

For example, a single series FET on a main antenna port is used for both a PA bypass (PA_bypass) branch and a low noise amplifier bypass (LNA_bypass) branch. This FET has a smaller gate width, than series FETs in the main PA (FETs of the second throw 302c) or LNA (e.g., FETs of the first throw 302b) branches. A smaller gate width results in lower parasitic capacitances when reverse biased (Cgs, Cds, etc.) and when the main transmit or receive paths are used, which minimizes or reduces any impact the bypass branches have on the overall performance of the main PA and LNA paths.

In an on state, slightly higher resistance can be tolerated because of a load current insertion loss (IL) associated with the smaller gate width. For example, when the bypass paths are being used, the transistor with the smaller gate width has a slightly higher drain to source resistance (Rds). However, the higher Rds is not a major concern because the insertion loss in the bypass modes is not critical. Comparing an Rds of 2-3 ohms (for a FET with a smaller gate width) versus an Rds of 0.5 ohms (for a FET with a larger gate width), the contribution to insertion loss by the higher Rds is small (e.g., only contributes a fraction of dB insertion loss). In addition, the parasitic capacitance introduced on the main path by this transistor with smaller gate width can be substantially smaller, perhaps 100 fF as opposed to 600 fF, resulting in a very small insertion loss increase for the main PA and LNA branches.

Figure 4B:
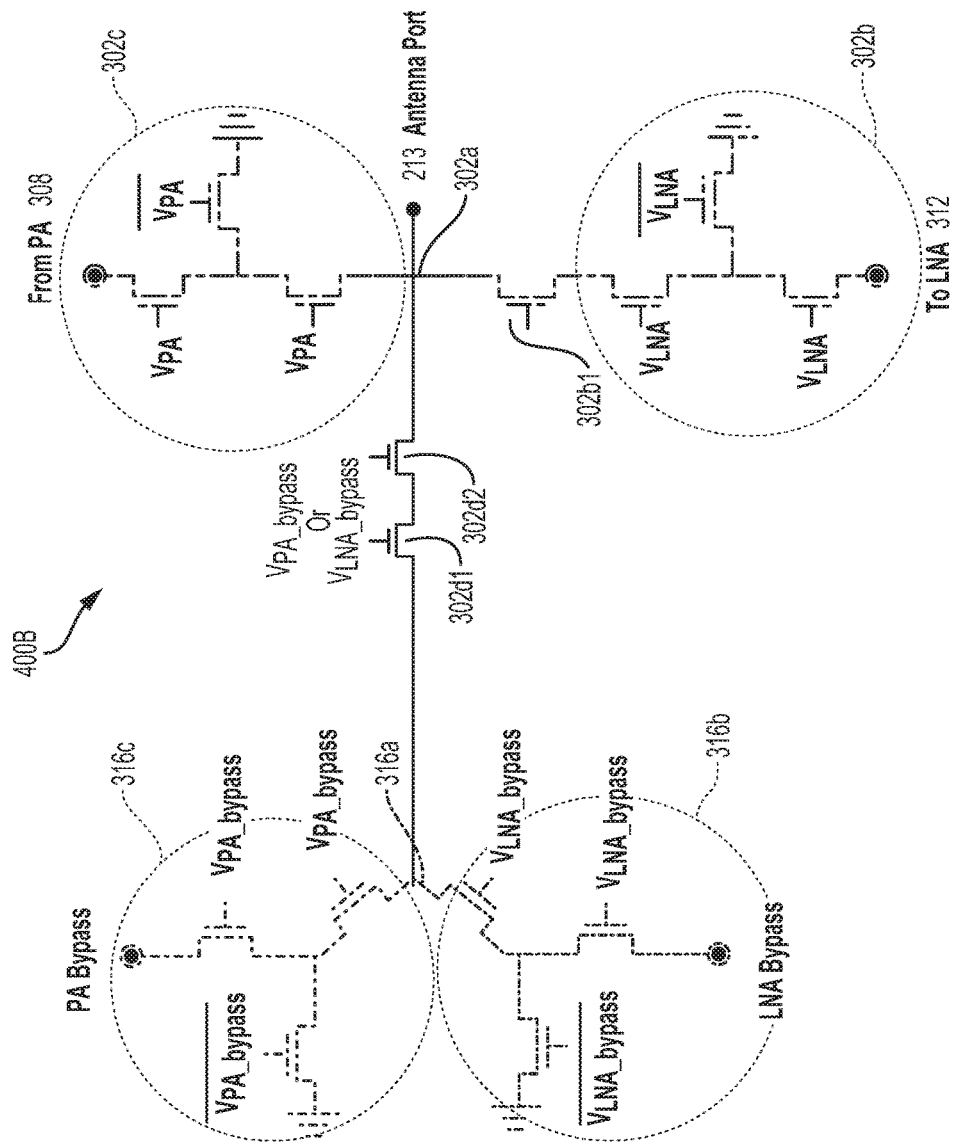
FIG. 4B illustrates an example of an asymmetrical switch including multiple series transistors placed sequentially to increase a breakdown voltage of the switch according to aspects of the present disclosure.
Figure 4C:
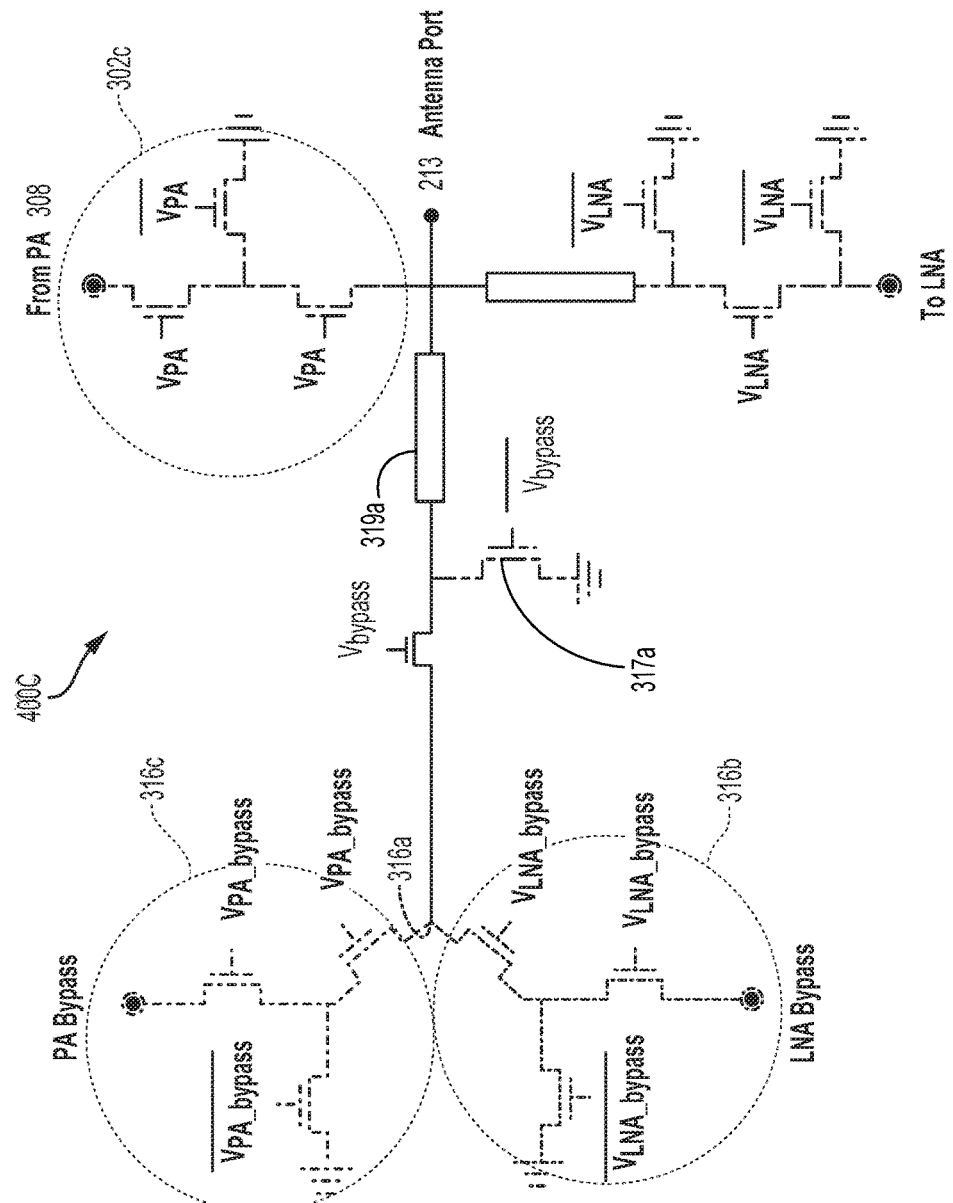
FIG. 4C illustrates an example of an asymmetrical switch including an impedance inverter to change a first transistor on the antenna branch of the switch from a series to a shunt transistor according to aspects of the present disclosure.

It should be understood that some of the FETs may be placed in series to enhance their ability to withstand high voltage swings generated by the power amplifier on the antenna port 213, as illustrated in FIG. 4B, while some of the FETs (e.g., shunt FETs) may be placed in parallel, to improve their ability to handle a large current swing, as illustrated in FIG. 4C.

FIG. 4B illustrates an example of an asymmetrical switch 400B including multiple series transistors placed sequentially to increase a breakdown voltage of the switch according to aspects of the present disclosure. For illustrative purposes, some of the labelling and numbering of the components and features of FIG. 4B are similar to those of FIG. 3 and FIG. 4A. However, FIG. 4B further includes multiple series transistors placed sequentially to increase the breakdown voltage of the TDD switch 302. For example, the third throw 302d of the switch 302 may include transistors 302d1 and 302d2 in series instead of a single transistor as illustrated in FIG. 4A. In addition, a transistor 302b1 is coupled in series to the first throw 302b of the TDD switch 302.

In some implementations, the transistors in the bypass path, or RX path, which are adjacent to the antenna port 213, are exposed to the highest voltage swing. To enhance the ability of the transistors to withstand the high voltage swing generated by the power amplifier on the antenna port 213, the transistors are implemented in accordance with the series configuration as illustrated in FIG. 4B. When the power amplifier 308 is transmitting at high power, the bypass switch (e.g., 316, 314, etc.) and a RX switch of the RX path are in an off state. In the off state the transistors (e.g., 302*d*1, 302*d*1, 302*b*1, etc.) are off and subject to large voltage swing. Placing multiple transistors in series enhances the ability of the transistors to withstand this large voltage swing while only slightly increasing power loss when those transistors are in the on state.

FIG. 4C illustrates an example of an asymmetrical switch 400C including an impedance inverter (e.g., quarter wave (lambda/4) transmission line) to change a first transistor on an antenna branch of the TDD switch 302 from a series to a shunt transistor. The lambda/4 transmission line or impedance inverter (e.g., 319*a* or 319*b*) rotates an impedance by one hundred and eighty (180) degrees on a Smith chart. When a low impedance is created on one end of the impedance inverter, a high impedance is seen on the other end of the impedance inverter.

In general, a first transistor (e.g., transistor 302*d*2 or 302*d*1) in each branch at the antenna port 213, should be a series transistor to create a high impedance when it is reverse biased. The branch that is active (e.g., bypass path, receive or LNA path, or transmit or PA path) may have its first series transistor biased to an "on" position, so that an RF signal can flow easily down that path. When the power amplifier is active and transmitting at full power, the first series transistor in the LNA and bypass paths should withstand the large RF voltage swing created by the PA. For a system where the peak power is 1 Watt, this corresponds to approximately 7 Volts root mean square (rms), which can be too large for some semiconductor processes.

When an impedance inverter (quarter wave transmission line, 90 degree phase shift, or a lumped element equivalent) is used to achieve a high impedance for the branches that are turned off at the common antenna port, a transmission line at an opposing end of the quarter wave transmission line should be shorted. To achieve the short, the first transistor is specified to be a shunt transistor. When a branch is turned off, the first shunt transistor is biased high, to create an RF ground on the signal path, and the low impedance is rotated to a high impedance at the antenna port 213. The benefit of this design approach is that the shunt transistor does not have to withstand the large voltage swing created by the high power PA stage, because it is at a node. Instead, the shunt transistor only handles the large current swing. This technique is beneficial especially when the TDD switch 302 is designed in a semiconductor process that does not support high RF voltages. The increase in die size due to the inclusion of the impedance inverters is a small price to pay for these additional benefits.

The technique illustrated in FIG. 4C may be used in low voltage processes where series transistors in a receive path are unable to handle a large voltage swing created by the PA 308 when it is transmitting at full power. The impedance inverter (e.g., 319*a* or 319*b*) allows the first transistor to be a shunt transistor, which creates an RF short circuit that is rotated to an open impedance at the antenna port. Given that the first transistor facing the antenna port is a shunt transistor, the transistor now supports a large current swing instead of a large voltage swing.

In one aspect of the disclosure, the RX path uses a quarter wave transmission line impedance inverter, or lumped element equivalent, in conjunction with a first shunt transistor (e.g., 317*a*, 317*b*, etc.), as shown in FIG. 4C, instead of a first series transistor (e.g., 302*d*2 or 302*b*1) as shown in FIG. 4B. When the RX switch is in the off state, the shunt transistor is conducting to ground, and hence creating an RF short on a transmission line (e.g., 319*b*) such as a quarter wave (lambda/4) transmission line. The quarter wave transmission line is used to rotate a low impedance to a high impedance at the common antenna port. This switch topology is occasionally used in processes where it is difficult to design a series transistor with a sufficiently large breakdown voltage to withstand the large voltage swing created by the power amplifier on the antenna port.

This switch topology could also be used for the bypass path. For this type of switch design, design tradeoffs that reduce insertion loss in the main TX and RX states could be used as well. One possible design trade off would be to use a quarter wave transmission line with an impedance greater than 50 Ohms, to reduce loading on the common antenna port. The impact of using a quarter wave transmission line with an impedance greater than 50 Ohms, would be a slightly larger insertion loss when this branch of the switch is in the on state. For the bypass path, this could be a good tradeoff because it may be preferable to reduce loading of the antenna port to favor performance in high power TX mode, or low noise RX mode.

The following figures (FIGS. 5-10) illustrate various bypass structures of the switchable low noise amplifier stage and a switchable power amplifier stage. The bypass structures provide examples of various bypass paths on different intermediate points along the transmit signal path 309 and the receive signal path 311.

Figure 5:
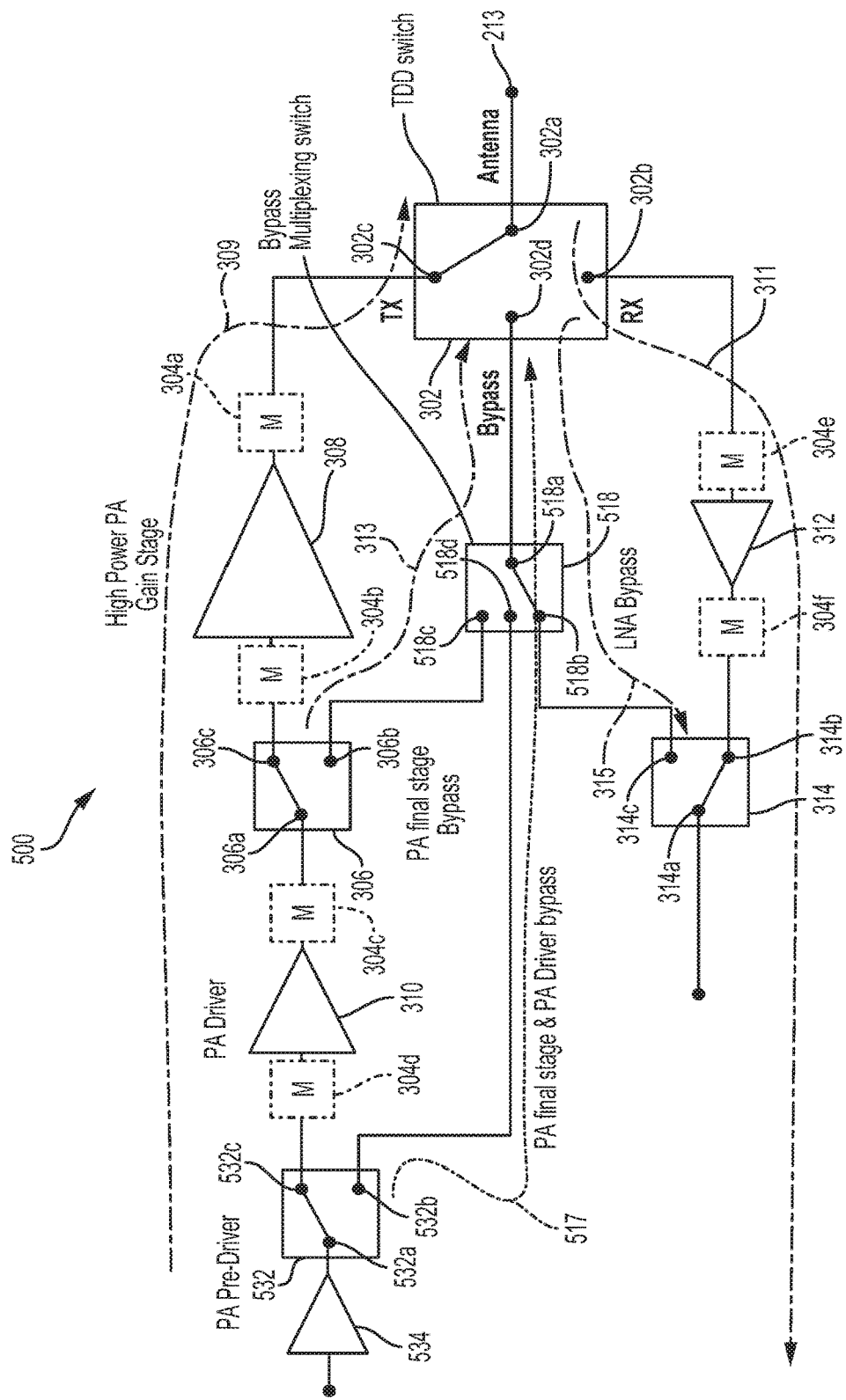
FIG. 5 illustrates another example of a switchable low noise amplifier stage and a switchable power amplifier stage according to aspects of the present disclosure.

FIG. 5 illustrates another example of a switchable low noise amplifier stage and a switchable power amplifier stage 500 according to aspects of the present disclosure. For illustrative purposes, some of the labelling and numbering of the components and features of FIG. 5 are similar to those of FIG. 3 and FIG. 4A. For example, in FIG. 5, the bypass multiplexing switch 316 of FIG. 3 is replaced with a bypass multiplexing switch 518 to introduce a second transmit bypass path 517.

The bypass multiplexing switch 518 is shared between the first transmit bypass path 313, the second transmit bypass path 517 and the first receive bypass path 315. The bypass multiplexing switch 518 selectively couples the first intermediate point of the transmit signal path 309 to the switch 302 to bypass the PA 308 (e.g., through the first transmit bypass path 313) during signal transmission. The bypass multiplexing switch 518 also selectively couples a second intermediate point of the transmit signal path 309 to the switch 302 to bypass the PA 308 and the PA driver 310 (e.g., through the second transmit bypass path 517) during signal transmission. Similarly, the bypass multiplexing switch 518 selectively couples the first intermediate point of the receive signal path 311 to the switch 302 to bypass the LNA 312 (e.g., through the first receive bypass path 315) during signal reception.

The bypass multiplexing switch 518 may be a single pole triple throw switch. A pole 518*a* of the bypass multiplexing switch 518 is coupled to the switch 302 such that transmit signals or receive signals are selectively propagated through the bypass multiplexing switch 518 and the switch 302 in the bypass mode instead of through the PA 308, the PA driver 310 or the LNA 312. The pole 518*a* is selectively coupled to a first throw 518*b*, a second throw 518*c* and a third throw 518*d* of the bypass multiplexing switch 518.

The second intermediate point of the transmit signal path 309 may be a third bypass switch 532. The third bypass switch 532 may be a single pole double throw switch that is selectively coupled to the transmit signal path 309 during a non-bypass mode and the second transmit bypass path 517 during the bypass mode. Thus, the third bypass switch 532 switches between the second transmit bypass path 517 and the transmit signal path 309. The third bypass switch 532 includes a pole 532*a* coupled to a PA pre-driver 534. The pole 532*a* is also selectively coupled to a first throw 532*b* and a second throw 532*c* of the third bypass switch 532 for respectively coupling to the second transmit bypass path 517 and the transmit signal path 309. For example, the first throw 532*b* is coupled to the third throw 518*d* of the bypass multiplexing switch 518 and the second throw 532*c* is coupled to the impedance matching circuit 304*d*.

A third throw (e.g., third throw 518*d*) is added to the bypass multiplexing switch 518 to allow an additional PA bypass mode (e.g., second transmit bypass mode), where both the PA driver 310 and the high power final stage (e.g., the PA 308) are bypassed. This implementation achieves even lower power operation, and correspondingly reduced power consumption when a user is close to the access point or the base station. This configuration includes five operating stages, namely, high power transmit stage, high power PA bypass stage, PA final stage and PA driver bypass stage, low noise receive stage and LNA bypass stage. Adding this extra bypass mode has reduced or no impact to the maximum transmit power or minimum receive noise figure because the additional path is coupled or connected to the bypass multiplexing switch (e.g., 518) instead of the main TDD switch (e.g., switch 302).

Figure 6:
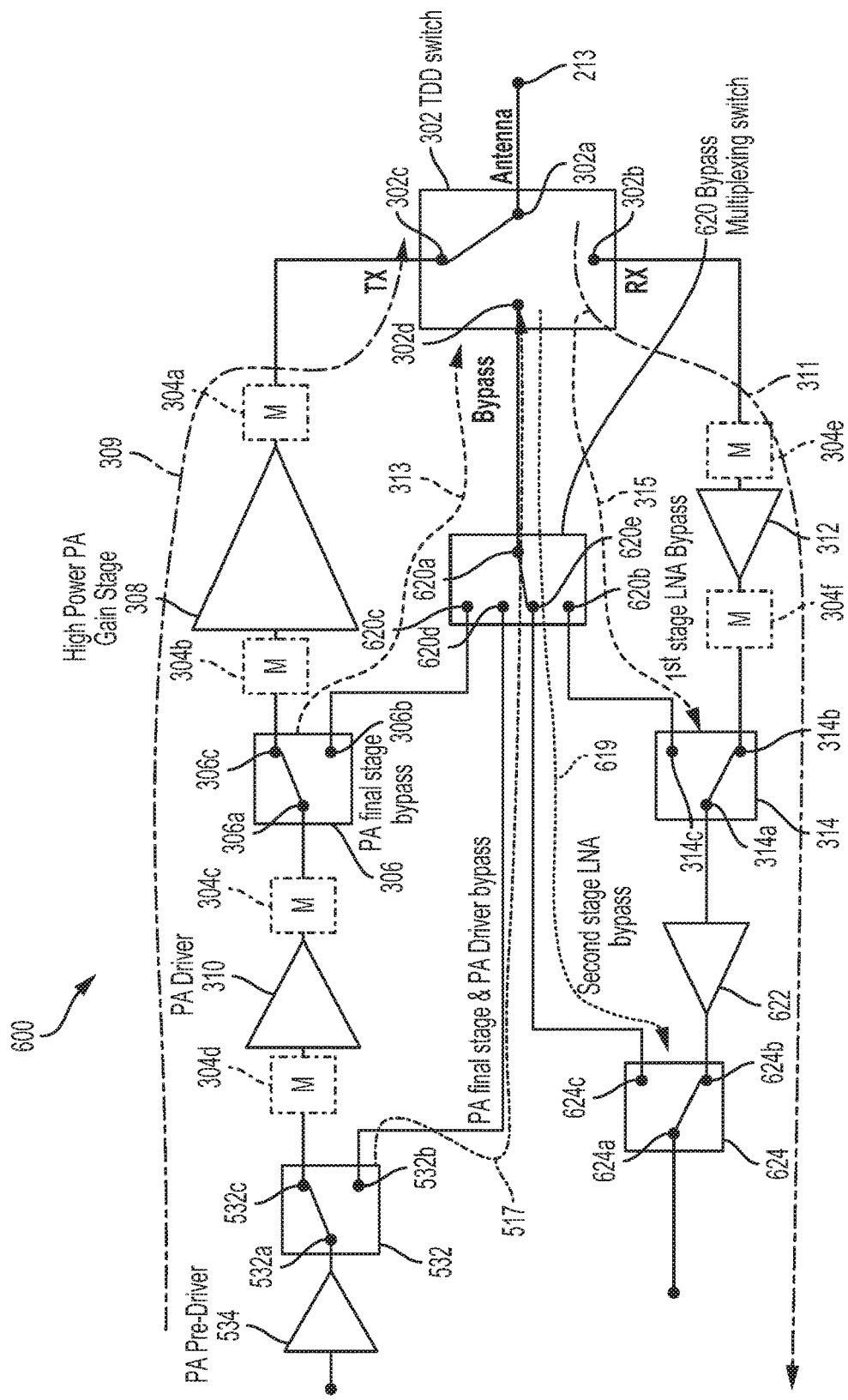
FIG. 6 illustrates another example of a switchable low noise amplifier stage and a switchable power amplifier stage according to aspects of the present disclosure.

FIG. 6 illustrates another example of a switchable low noise amplifier stage and a switchable power amplifier stage 600 according to aspects of the present disclosure. For illustrative purposes, some of the labelling and numbering of the components and features of FIG. 6 are similar to those of FIG. 3, FIG. 4A and FIG. 5. For example, in FIG. 6, the bypass multiplexing switch 518 of FIG. 5 is replaced with a bypass multiplexing switch 620 to introduce a second receive bypass path 619.

The bypass multiplexing switch 620 is shared between the first transmit bypass path 313, the second transmit bypass path 517, the first receive bypass path 315 and the second receive bypass path 619. The bypass multiplexing switch 620 selectively couples the first intermediate point of the transmit signal path 309 to the switch 302 to bypass the PA 308 (e.g., through the first transmit bypass path 313) during a first transmit bypass mode. The bypass multiplexing switch 620 also selectively couples the second intermediate point of the transmit signal path 309 to the switch 302 to bypass the PA 308 and the PA driver 310 (e.g., through the second transmit bypass path 517) during a second transmit bypass mode.

The bypass multiplexing switch 620 selectively couples the first intermediate point of the receive signal path 311 to the switch 302 to bypass the LNA 312 (e.g., through the first receive bypass path 315) during a first receive bypass mode. The bypass multiplexing switch 620 also selectively couples a second intermediate point of the receive signal path 311 to the switch 302 to bypass the LNA 312 and another LNA 622 (e.g., through the second receive bypass path 619) during a second receive bypass mode.

The bypass multiplexing switch 620 may be a single pole quadruple throw switch. A pole 620*a* of the bypass multiplexing switch 620 is coupled to the third throw 302*d* of the switch 302 such that transmit signals or receive signals are selectively propagated through the bypass multiplexing switch 620 and the switch 302 in the bypass mode instead of through the PA 308, the PA driver 310, the LNA 312 or the LNA 622. The pole 620*a* is selectively coupled to a first throw 620*b*, a second throw 620*c*, a third throw 620*d* and a fourth throw 620*e* of the bypass multiplexing switch 620.

The second intermediate point of the receive signal path 311 may be a fourth bypass switch 624. The fourth bypass switch 624 may be a single pole double throw switch that is selectively coupled to the receive signal path 311 during a non-bypass mode and the second receive bypass path 619 during the bypass mode. Thus, the fourth bypass switch 624 switches between the second receive bypass path 619 and the receive signal path 311.

The fourth bypass switch 624 includes a pole 624*a*, which may be coupled to an RF circuit (not shown). The pole 624*a* is also selectively coupled to a first throw 624*b* and a second throw 624*c* of the fourth bypass switch 624 for respectively coupling to the second receive bypass path 619 and the receive signal path 311. For example, the second throw 624*c* is coupled to the fourth throw 620*e* of the bypass multiplexing switch 620 and the first throw 624*b* is coupled to the LNA 622. The first throw 620*b* of the bypass multiplexing switch 620 is coupled to the second throw 314*c* of the first bypass switch 314. The second throw 620*c* of the bypass multiplexing switch 620 is coupled to the first throw 306*b* of the second bypass switch 306. The third throw 620*d* of the bypass multiplexing switch 620 is coupled to the first throw 532*b* of the third bypass switch 532.

A fourth throw (e.g., fourth throw 620*e*) is added to the bypass multiplexing switch 620 to allow an additional LNA bypass mode (e.g., second receive bypass mode), where both a first LNA stage (e.g., LNA 312) and a second LNA stage (e.g., LNA 622) are bypassed. This configuration achieves six operating stages, namely, the high power transmit stage (e.g., non-bypass mode for transmission), the high power PA bypass stage (e.g., first bypass mode), the PA final stage and PA driver bypass stage (e.g., second transmit bypass mode), the low noise receive stage (e.g., non-bypass mode for reception), a first LNA bypass stage (e.g., first receive bypass mode) and a second LNA bypass stage (e.g., second receive bypass mode). This type of implementation achieves a large degree of flexibility. For example, PA power dissipation can be reduced in three stages, which achieves a 10×, and 100× reduction in power consumption.

Tables 3, 4 and 5 show example values for P1 dB, rms power, gain and power consumption of the PA pre-driver 534, the PA driver amplifier 310 and the final power amplifier stage 308 (or the high power PA gain stage) of FIGS. 6, 7, 8 and 9A-C. The P1 dB and gain for the final power amplifier stage 308 and the PA driver amplifier 310 are identical to those in Tables 1 and 2. The inclusion of the PA pre-driver 534 along with the bypass path 517 provides a third transmit mode, which offers additional power savings.

Table 3 illustrates an operating condition where all three gain blocks in the transmit signal path 309 are being used. A maximum power of 23 dBm can be generated and the total power consumption of the three combined gain blocks would be 878 mW.

Table 4 illustrates settings where the final power amplifier stage 308 is bypassed, and the signal leaves the PA driver amplifier 310 and accesses the antenna port via the bypass path 313. In this condition, a maximum power of 14 dBm can be generated with comparable distortion, and the total power consumption of the transmit stage is 106 mA.

When the wireless device 100 is using a very narrow operating bandwidth and is relatively close to the base station or access point, an even lower operating mode is possible where the PA pre-driver 534 can directly access the antenna via the bypass path 517. In this mode, the total power consumption of the transmit stage is only 6.4 mA and the maximum power that can be transmitted by the transmitter is 2 dBm, as illustrated in Table 5.

TABLE 3

PA lineup using 3 gain blocks

|  | Input | Pre-Driver 534 | Driver Amplifier 304 Output | Power Amplifier final stage - 308 Output | Total Power Consumption |
| --- | --- | --- | --- | --- | --- |
| P1dB (dBm) |  | 11 | 23 | 32 |  |
| Gain (dB) |  | 15 | 15 | 12 |  |
| Prms (dBm) | −19 | −4 | 11 | 23 |  |
| Backoff from P1dB |  | 15 | 12 | 9 |  |
| Efficiency |  | 12.4% | 17.6% | 24.8% |  |
| DC Power Consumption (mW) |  | 3 | 72 | 803 | 878 |

TABLE 4

PA lineup using 3 gain blocks, where final high power gain stage is bypassed.

|  | Input | Pre-Driver 534 | Driver Amplifier 304 Output | Power Amplifier final stage - 308 Output | Total Power Consumption |
| --- | --- | --- | --- | --- | --- |
| P1dB (dBm) |  | 11 | 23 | Bypassed |  |
| Gain (dB) |  | 15 | 15 | Bypassed |  |
| Prms (dBm) | −16 | −1 | 14 | Bypassed |  |
| Backoff from P1dB |  | 12 | 9 | Bypassed |  |
| Efficiency |  | 17.6% | 24.8% | Bypassed |  |
| DC Power Consumption (mW) |  | 4.5 | 101 |  | 106 |

TABLE 5

PA lineup using 3 gain blocks, where final high power gain stage and driver are bypassed.

|  | Input | Pre-Driver 534 | Driver Amplifier 304 Output | Power Amplifier final stage - 308 Output | Total Power Consumption |
| --- | --- | --- | --- | --- | --- |
| P1dB (dBm) |  | 11 | Bypassed | Bypassed |  |
| Gain (dB) |  | 15 | Bypassed | Bypassed |  |
| Prms (dBm) | −13 | 2 | Bypassed | Bypassed |  |
| Backoff from P1dB |  | 9 | Bypassed | Bypassed |  |
| Efficiency |  | 24.8% | Bypassed | Bypassed |  |
| DC Power Consumption (mW) |  | 6.4 |  |  | 6.4 |

The inclusion of multiple gain settings in the power amplifier stage allows for reduction in power consumption by the power amplifier stage from 878 mA when the system specifies maximum power, to a very modest 6.4 mA when the system specifies 2 dBm of RF power or less. In some instances, the reduction in power consumption can be greater than 100 times the DC power consumption from the PA 308. Although 2 dBm is a very modest power level, it is sufficient to provide a reliable communication link over a small distance.

For a 5 MHz carrier, the system sensitivity may be −100 dBm for a quadrature phase shift keying (QPSK) half (½) rate encoding for a total link budget of over 100 dB. For a modulation and coding scheme 9 (MCS9) 256 quadrature amplitude modulation (QAM), or a 64 QAM 5/6 encoding using a 5 MHz carrier, an RSSI of about −77 dBm may be specified and for a 20 MHz bandwidth the specified RSSI would be approximately −71 dbm. This would represent a path loss of 73 dB plus antenna gain, which is sufficient to allow a user to connect across a fairly large room using a 256 QAM modulation, even when using a very modest 2 mW of RF transmit power. The ability to reduce the total power consumption from 878 mA to only 6.4 mA (in this example) nearly eliminates the current draw from the final power amplifier stage 308, and enables communication links to be maintained for extended periods of time with very little battery usage. The use of multiple steps or modes allows finer granularity when setting the transmit power, to optimize power savings for a given path loss between two devices.

The impact to the maximum transmit power or minimum receive noise figure due to the additional path on the bypass switch, as opposed to the main TDD switch is minimal or nonexistent. Thus, the addition of the third and the fourth throw to the bypass multiplexing switch only slightly increases the path loss of the bypass paths compared to implementations where the bypass multiplexing switch has a smaller number of throws (e.g., two or three throws). However, all the bypass modes are configurations where reduced performance is permitted and hence the slightly increased path loss is acceptable.

Figure 7:
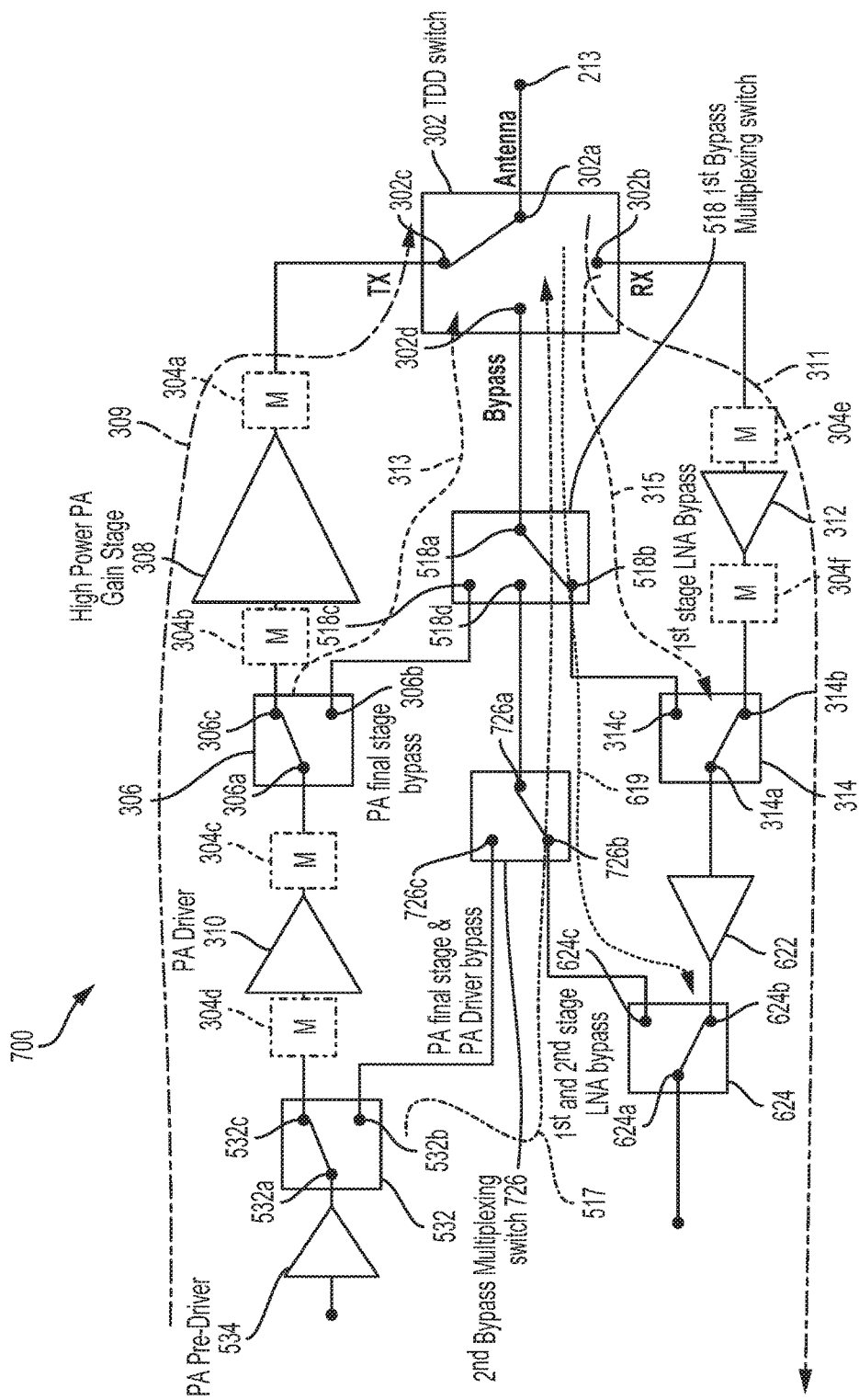
FIG. 7 illustrates an additional example of a switchable low noise amplifier stage and a switchable power amplifier stage according to aspects of the present disclosure.

FIG. 7 illustrates an additional example of a switchable low noise amplifier stage and a switchable power amplifier stage 700 according to aspects of the present disclosure. For illustrative purposes, some of the labelling and numbering of the components and features of FIG. 7 are similar to those of FIG. 3, FIG. 4A, FIG. 5 and FIG. 6. For example, in FIG. 7, the bypass multiplexing switch 518 of FIG. 5 is coupled to a second bypass multiplexing switch 726 to introduce the second transmit bypass path 517 and the second receive bypass path 619.

The bypass multiplexing switch 518 and the second bypass multiplexing switch 726 are shared between the second transmit bypass path 517 and the second receive bypass path 619. The second bypass multiplexing switch 726 selectively couples the second intermediate point of the transmit signal path 309 to the switch 302 via the bypass multiplexing switch 518 to bypass the PA 308 and the PA driver 310 (e.g., through the second transmit bypass path 517) during the second transmit bypass mode. Similarly, the second bypass multiplexing switch 726 selectively couples the second intermediate point of the receive signal path 311 to the switch 302 via the bypass multiplexing switch 518 to bypass the LNA 312 and the LNA 622 (e.g., through the second receive bypass path 619) during the second receive bypass mode.

The second bypass multiplexing switch 726 may be a single pole double throw switch. Unlike the configuration of FIG. 6, in FIG. 7, a pole 726a of the second bypass multiplexing switch 726 is coupled to the third throw 518d of the bypass multiplexing switch 518 such that transmit signals or receive signals are selectively propagated through the second bypass multiplexing switch 726, the bypass multiplexing switch 518 and the switch 302 during the bypass mode. The pole 726a is selectively coupled to a first throw 726b and a second throw 726c of the second bypass multiplexing switch 726. The first throw 726b is coupled to the second throw 624c of the fourth bypass switch 624 and the second throw 726c is coupled to the first throw 532b of the third bypass switch 532.

Similar to the configuration of FIG. 6, the configuration of FIG. 7 achieves six operating stages, namely, the high power transmit stage, the high power PA bypass stage, the PA final stage and PA driver bypass stage, the low noise receive stage, the first LNA bypass stage, and the second LNA bypass stage.

The main high power PA (e.g., the PA 308) and the LNA 312 are at a first hierarchy level that places them at a closer proximity (may be directly connected) to the TDD switch (e.g., switch 302) and enjoy minimum or reduced loss from their respective output/input to the antenna. A second hierarchy level is provided for signals directly connected to a first bypass multiplexing switch (e.g., bypass multiplexing switch 518) for the PA final stage bypass mode (e.g., to bypass the PA 308). The PA final stage bypass mode uses the first transmit bypass path 313 and first stage LNA bypass mode to bypass the LNA 312 and the first receive bypass path 315. These two bypass paths are secondary operating modes, and can tolerate the additional insertion loss resulting from passing through the first bypass multiplexing switch.

A third hierarchy level is provided for devices connected to an additional or second bypass multiplexing switch (e.g., second bypass multiplexing switch 726). The third hierarchy includes the PA final stage and the PA driver bypass mode using the second transmit bypass path 517 as well as the first and second stage LNA bypass modes using the second receive bypass path 619. These two modes may be implemented when the path loss from the user to the access point or base station is very small, and very little transmit power or receiver gain is specified. However, the signals using these two modes would incur additional loss, albeit minimal, because they should pass through the second bypass multiplexing switch and the first bypass multiplexing switch prior to being connected to the TDD switch.

Three or more levels of hierarchy can be used to prioritize the performance of some bypass modes over others. In this case, bypass modes connected directly to the first bypass multiplexing switch enjoy less path loss than signals routed through the second bypass multiplexing switch or subsequent bypass switches. Signals connected directly to the TDD switch enjoy the highest level of performance.

Figure 8:
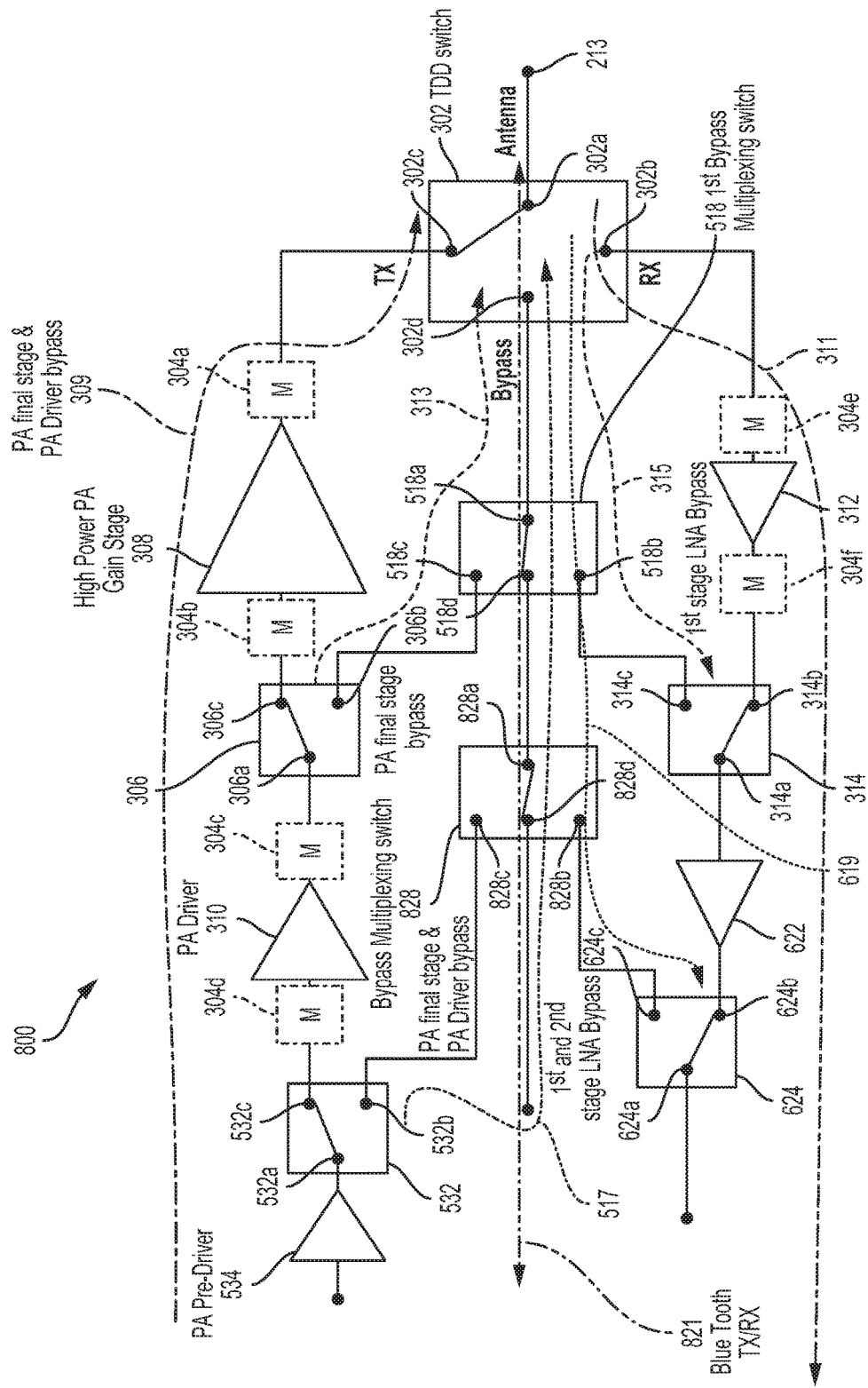
FIG. 8 illustrates yet another example of a switchable low noise amplifier stage and a switchable power amplifier stage according to aspects of the present disclosure.

FIG. 8 illustrates yet another example of a switchable low noise amplifier stage and a switchable power amplifier stage 800 according to aspects of the present disclosure. For illustrative purposes, some of the labelling and numbering of the components and features of FIG. 8 are similar to those of FIG. 3, FIG. 4A, FIG. 5, FIG. 6 and FIG. 7. The second bypass multiplexing switch 726 of FIG. 7 is replaced with a third bypass multiplexing switch 828 in FIG. 8.

The bypass multiplexing switch 518 and the third bypass multiplexing switch 828 are shared between the second transmit bypass path 517, the second receive bypass path 619 and a third bypass path or radio access technology (RAT) path 821. The RAT path 821 may be an auxiliary channel that is tapped to the third bypass multiplexing switch 828 to allow access by a communication protocol (e.g., Bluetooth communication protocol) to the antenna. The third bypass multiplexing switch 828 selectively couples the second intermediate point of the transmit signal path 309 to the switch 302 via the bypass multiplexing switch 518 to bypass the PA 308 and the PA driver 310 (e.g., through the second transmit bypass path 517) during the second transmit bypass mode.

Similarly, the third bypass multiplexing switch 828 selectively couples the second intermediate point of the receive signal path 311 to the switch 302 via the bypass multiplexing switch 518 to bypass the LNA 312 and the LNA 622 (e.g., through the second receive bypass path 619) during the second receive bypass mode. The third bypass multiplexing switch 828 selectively couples a RAT device (e.g., Bluetooth device) to the third bypass path 821. For example, the third bypass path 821 may be used for transmitting and receiving in accordance with a Bluetooth communication protocol. The auxiliary channel may be tapped into other switches, such as the switch 302, the switch 828, the switch 518 or the switch 920 (below) and may be used for the transmitting and receiving based on the Bluetooth communication protocol or any other communication protocols of the RAT device.

The third bypass multiplexing switch 828 may be a single pole triple throw switch. A pole 828a of the third bypass multiplexing switch 828 is coupled to the third throw 518d of the bypass multiplexing switch 518 such that transmit signals or receive signals are selectively propagated through the third bypass multiplexing switch 828, the bypass multiplexing switch 518 and the switch 302 during the bypass mode. The pole 828a is selectively coupled to a first throw 828b, a second throw 828c and a third throw 828d of the third bypass multiplexing switch 828. The first throw 828b is coupled to the second throw 624c of the fourth bypass switch 624 and the second throw 828c is coupled to the first throw 532b of the third bypass switch 532. The third throw 828d is coupled to the third bypass path 821 for the RAT device (not shown) communication.

Similar to the configuration of FIGS. 6 and 7, the configuration of FIG. 8 achieves six operating stages, namely, the high power transmit stage, the high power PA bypass stage, the PA final stage and PA driver bypass stage, the low noise receive stage, the first LNA bypass stage and the second LNA bypass stage.

A third throw (e.g., third throw 828d) is added to the third bypass multiplexing switch 828 to allow another communication protocol (e.g., Bluetooth (BT)), to access the antenna. A RAT device (e.g., Bluetooth device/transceiver) may be coupled to the third bypass multiplexing switch 828 with a low priority from a performance perspective because Bluetooth signals from the Bluetooth transceiver pass through the third and first bypass multiplexing switches 828 and 518 before arriving at the TDD switch. For example, the Bluetooth transceiver may be connected at the third level of the bypass hierarchy. Different communication protocol devices or RAT devices other than Bluetooth may be used in aspects of the present disclosure . . . .

Figure 9A:
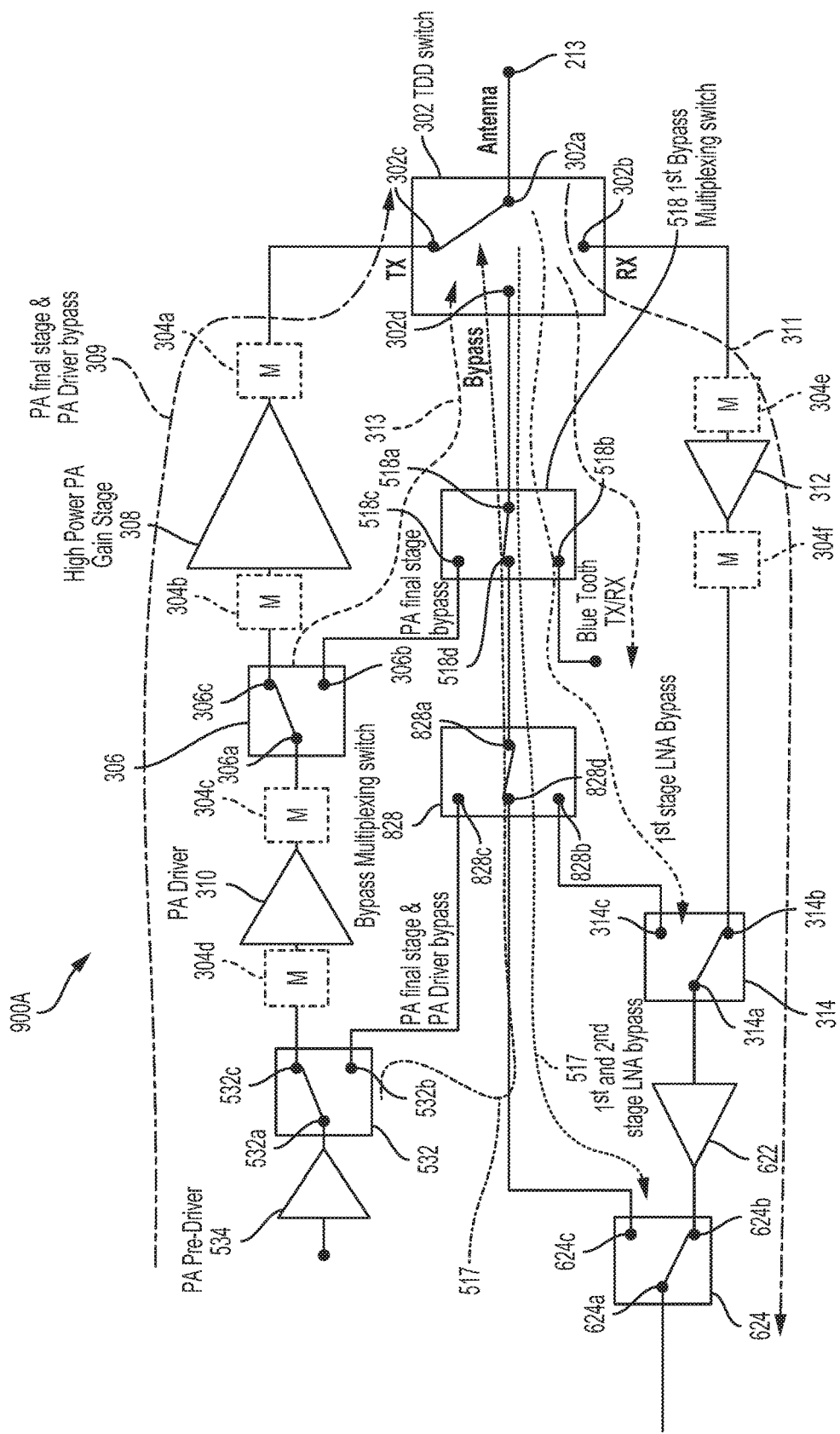
FIG. 9A illustrates a further example of a switchable low noise amplifier stage and a switchable power amplifier stage according to aspects of the present disclosure.

FIG. 9A illustrates a further example of a switchable low noise amplifier stage and a switchable power amplifier stage 900A according to aspects of the present disclosure. For illustrative purposes, some of the labelling and numbering of the components and features of FIG. 9A are similar to those of FIG. 3, FIG. 4A, FIG. 5, FIG. 6, FIG. 7 and FIG. 8. In FIG. 9A, the first throw 828b of the third bypass multiplexing switch 828 is coupled to the second throw 314c of the first bypass switch 314 instead of the fourth bypass switch 624, as in FIG. 8. In addition, the third throw 828d of the third bypass multiplexing switch 828 is coupled to the second throw 624c of the fourth bypass switch 624 instead of the Bluetooth transceiver, as in FIG. 8.

The configuration of FIG. 9A achieves six operating stages, namely, the high power transmit stage, the high power PA bypass stage, the PA final stage and PA driver bypass stage, the low noise receive stage, the first LNA bypass stage and the second LNA bypass stage.

The first throw 518b of the bypass multiplexing switch 518 may be coupled to the RAT device (e.g., Bluetooth transceiver (TX/RX)) instead of the second throw 314c of the first bypass switch 314. Connecting the Bluetooth transceiver closer (at the bypass multiplexing switch 518) to the TDD switch improves the priority and performance of the Bluetooth transceiver communication. This aspect shows an implementation where all receive bypass modes are assigned a third level in the bypass hierarchy and are connected to the third bypass multiplexing switch 828. The PA final stage bypass mode and the Bluetooth transceiver are given a second level of prioritization in the bypass hierarchy. This example illustrates that the first LNA bypass may not be connected to the first bypass switch, and could be given a lower level of priority.

Figure 9B:
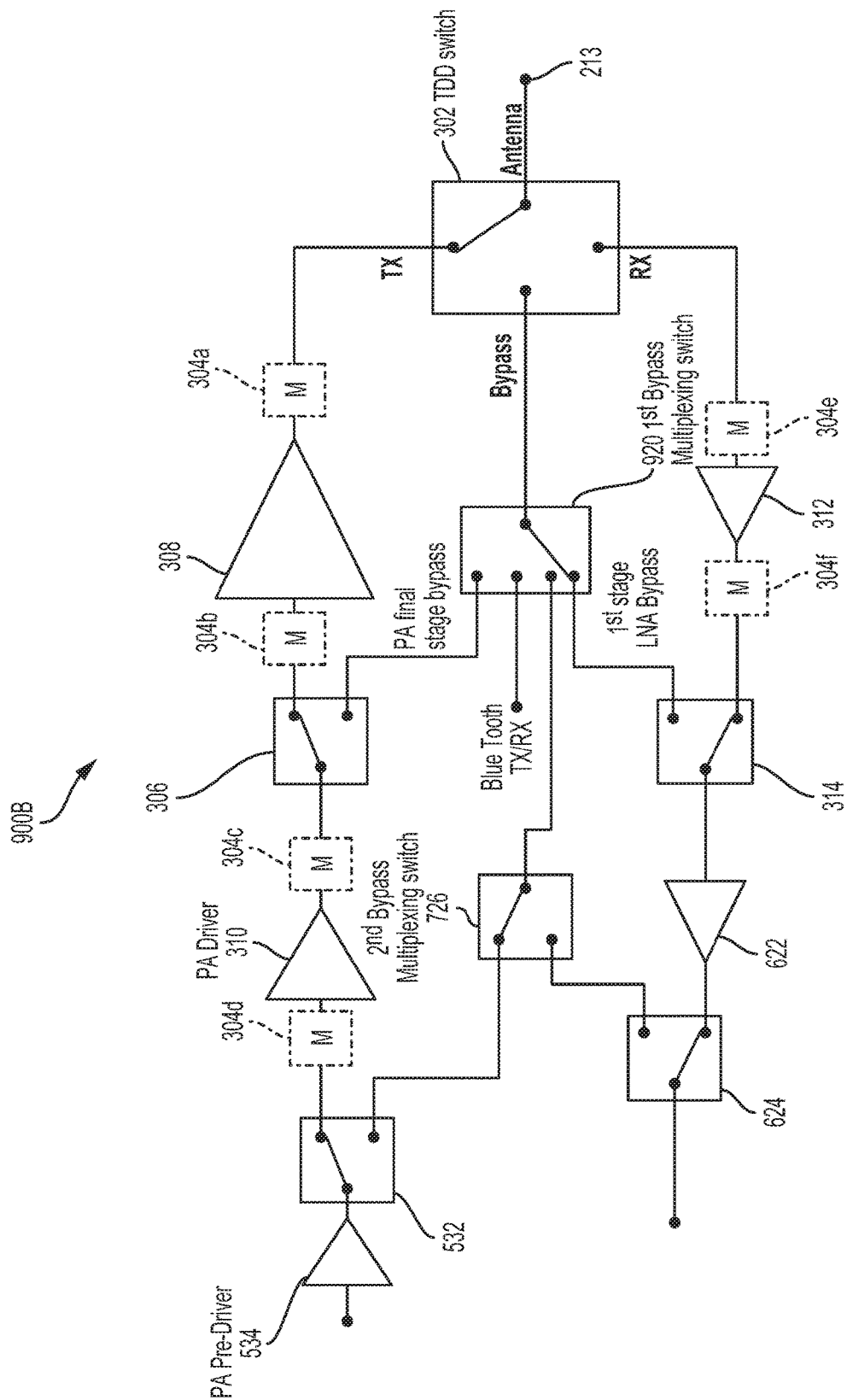
FIG. 9B illustrates another example of a switchable low noise amplifier stage and a switchable power amplifier stage according to aspects of the present disclosure.

FIG. 9B illustrates another example of a switchable low noise amplifier stage and a switchable power amplifier stage 900B according to aspects of the present disclosure. For illustrative purposes, some of the labelling and numbering of the components and features of FIG. 9B are similar to those of FIG. 3, FIG. 4A, FIG. 5, FIG. 6, FIG. 7 and FIG. 8. In FIG. 9B, the single pole triple throw switch (e.g., the bypass multiplexing switch 518) of FIG. 7 is replaced with a single pole quadruple throw switch (e.g., bypass multiplexing switch 920). The additional throw of the bypass multiplexing switch 920 is coupled to the Bluetooth transceiver.

The configuration of FIG. 9B achieves six operating stages, namely, the high power transmit stage, the high power PA bypass stage, the PA final stage and PA driver bypass stage, the low noise receive stage, the first LNA bypass stage and the second LNA bypass stage. In FIG. 9B, the Bluetooth transceiver is connected to the first bypass multiplexing switch (e.g., bypass multiplexing switch 920) and hence has been promoted to the second level of the bypass hierarchy. In this configuration, Bluetooth communication is allocated a same level of priority as the PA final stage bypass path and the first stage LNA bypass path.

Figure 9C:
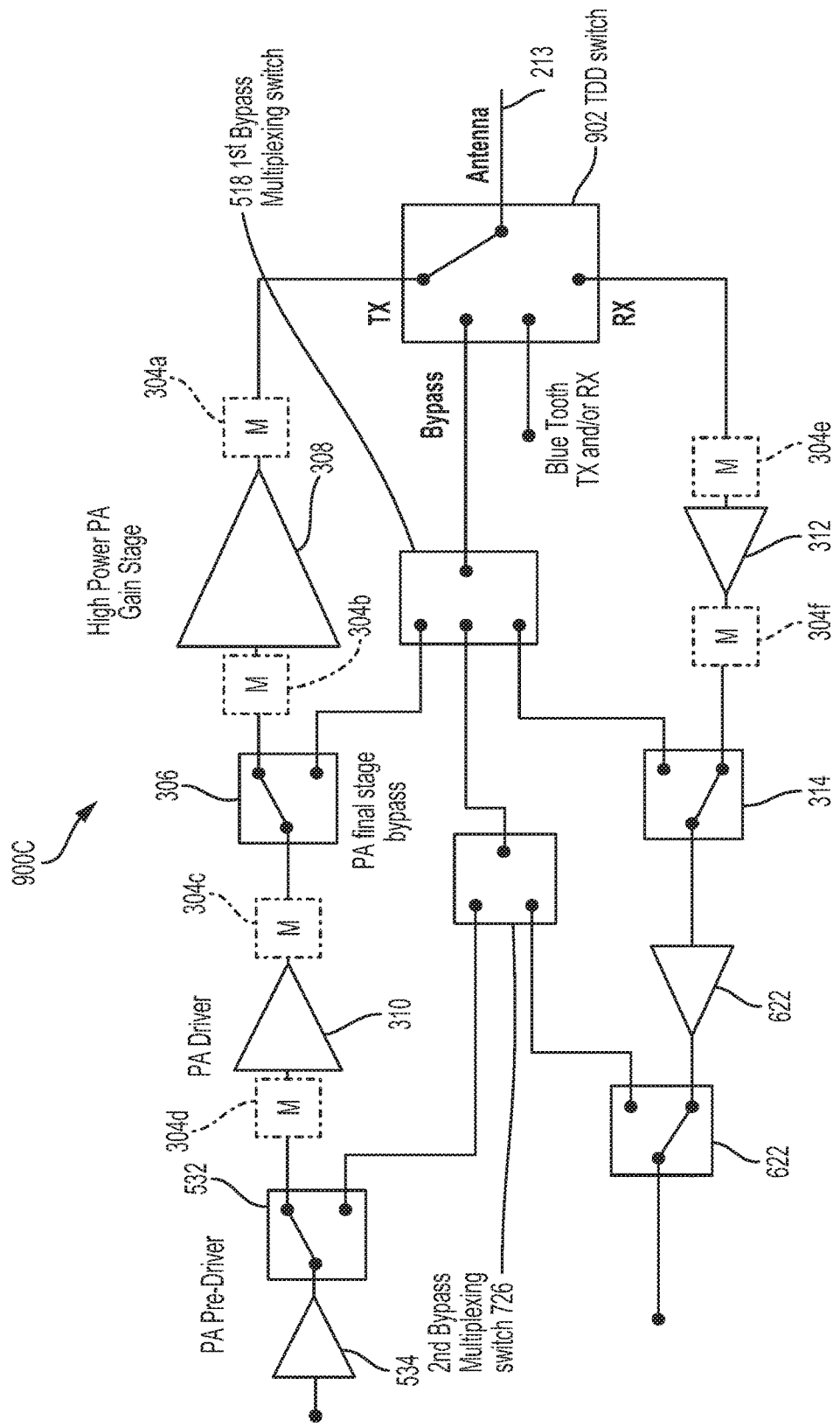
FIG. 9C illustrates another example of a switchable low noise amplifier stage and a switchable power amplifier stage according to aspects of the present disclosure.

FIG. 9C illustrates another example of a switchable low noise amplifier stage and a switchable power amplifier stage 900C according to aspects of the present disclosure. For illustrative purposes, some of the labelling and numbering of the components and features of FIG. 9C are similar to those of FIG. 3, FIG. 4A, FIG. 5, FIG. 6, FIG. 7 and FIG. 8. In FIG. 9C, the single pole triple throw switch (e.g., the switch 302) of FIG. 7 is replaced with a single pole quadruple throw switch (e.g., switch 902). The additional throw of the switch 902 is coupled to the Bluetooth transceiver.

In this aspect, the Bluetooth transceiver is promoted to the highest hierarchy and is connected directly to the TDD switch (e.g., switch 902), and enjoys the lowest path loss. The Bluetooth transceiver is prioritized at a same level as the main high power transmit and high gain/low noise receive paths. An extra throw is added to the TDD switch to support Bluetooth communications, which slightly degrades the performance of the main transmit (e.g., transmit signal path 309) and main receive (e.g., receive signal path 311) paths. The low power transmit and bypass receive paths are still routed through the bypass multiplexing switches, and hence have no impact on the primary path performance.

Figure 10:
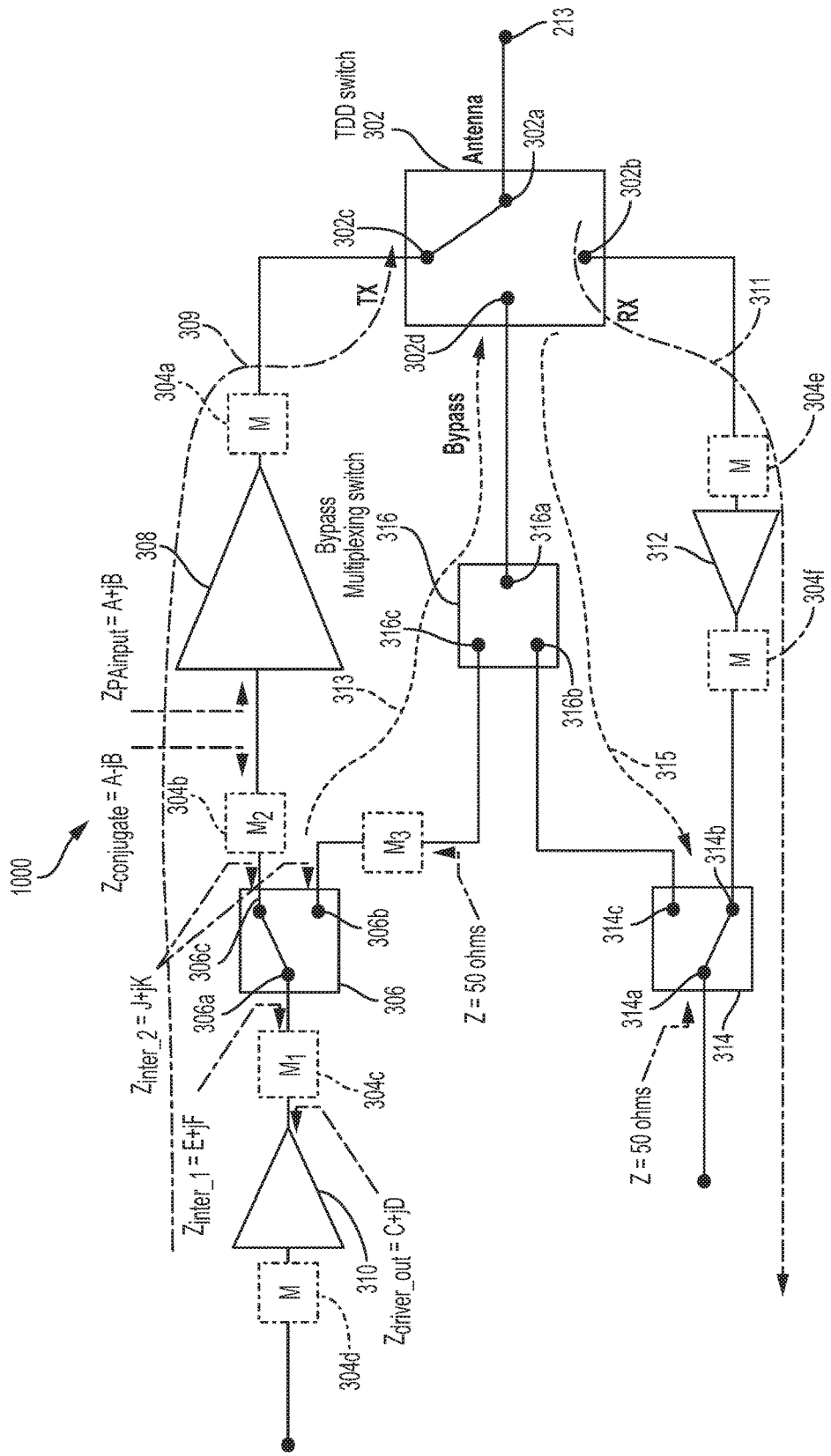
FIG. 10 illustrates conjugate matching on a switchable amplifier stage according to aspects of the present disclosure.

FIG. 10 illustrates conjugate matching on a switchable amplifier stage according to aspects of the present disclosure. For illustrative purposes, some of the labelling and numbering of the components and features of FIG. 10 are similar to those of FIG. 3, FIG. 4A, FIG. 5, FIG. 6, FIG. 7 and FIG. 8. For example, the configuration of FIG. 10 is similar to the configuration of FIG. 3. For simplicity the previous diagrams have shown a matching network or impedance matching circuit (e.g., impedance matching circuits 304a, 304b, 304c, 304d, 304e and 3040 at the input and output of each gain block. Two general methods may be implemented for the impedance matching circuit. For discrete implementations, the convention is to match the input and output of each amplifier to fifty (50) ohms to ensure an optimal power transfer between two successive circuits. For integrated designs where it is known that two elements in a circuit are used together, a slightly smaller circuit can be achieved by implementing a conjugate match between two circuits. Fewer components are specified for the conjugate match method, which results in a smaller design, usually with better performance.

FIG. 10 illustrates how a complex conjugate match could be implemented between the PA driver output and the PA input according to aspects of the present disclosure. An output impedance of the PA Driver is given by $Z_{driver\_out}=C+jD$, where C and D are two variables that quantify real (resistive) and imaginary (reactive) components of the impedance in Ohms. For a real device, the driver output impedance ($Z_{driver\_out}$) corresponds to an impedance considerably lower than fifty (50) ohms, and has a real component that is usually lower than 50 Ohms as well as an imaginary component that can be either capacitive or inductive, depending on the specifics of the semiconductor design and packaging. Usually, the larger the power of the PA, the lower the input and output impedances. This is due to the fact that more transistors should be placed in parallel to achieve the desired RF power.

If the $Z_{driver\_out}$ is very low, or has a large reactive component, it may be desirable to have matching circuit M1 to transform the impedance to an intermediate impedance $Z_{inter\_1}$ prior to the switch (e.g., second bypass switch 306). When the switch is in the on state, it should introduce a very small real component due to the resistance of the FETs and a small reactive component due to the parasitic capacitance of the shunt transistors that are reverse biased. Nevertheless, there would be a small change in the impedance, to arrive at $Z_{inter\_2}$ at the output of the switch (looking back towards the driver (e.g., PA driver 310)). The final matching network, M2, transforms the impedance from $Z_{inter\_2}$, to $Z_{conjugate}$ The impedance at the output of M2, looking back towards the driver (e.g., PA driver 310), should be the complex conjugate of the impedance $Z_{PAinput}$, looking into the PA input, to achieve an optimal power transfer.

Because the impedance is not transformed to near 50 ohms at the output of M1, the impedance looking back towards the driver output, via the output of the bypass switch (e.g., bypass switch 306, first throw 306b), should not be 50 ohms, but similar to $Z_{inter\_2}$. It is therefore desirable to have matching network, M3, to transform the impedance from $Z_{inter\_2}$ to a desired impedance of 50 ohms.

Although 50 ohms is used in this example because it is a standard impedance, other impedances could be used. For example, impedances such as 75 ohms, which is commonly used in the cable TV networks, or potentially another impedance, which would be used locally on the board or on the chip could be used. For small circuits where a trace width is specified to be smaller, 100 ohms or 200 ohms are also occasionally used locally. Also, the traces can be single ended, or differential. For a silicon radio frequency integrated circuit (RFIC), the amplifiers are usually based on a differential pair and all traces and matching networks could be implemented on a differential trace. For gallium arsenide (GaAs) or printed circuit board (PCB) designs, single ended circuits are usually used.

A large benefit of the conjugate match approach can be achieved when the $Z_{driver\_out}$ and $Z_{PAinput}$ are fairly close to one another, but relatively far from 50 ohms. It is therefore much easier to provide a complex conjugate match between two impedances that are fairly close on the Smith chart, without transforming the impedances to an intermediate value of 50 ohms, which may be relatively far from both $Z_{driver\_out}$ and $Z_{PA\ input}$.

The complex conjugate approach can be used between any two circuits, such as the PA pre-driver and the PA driver or the PA driver and the PA as well as the first stage LNA and the second stage LNA, or potentially even between the TDD switch and the PA or the TDD switch and the LNA input.

Figure 11:
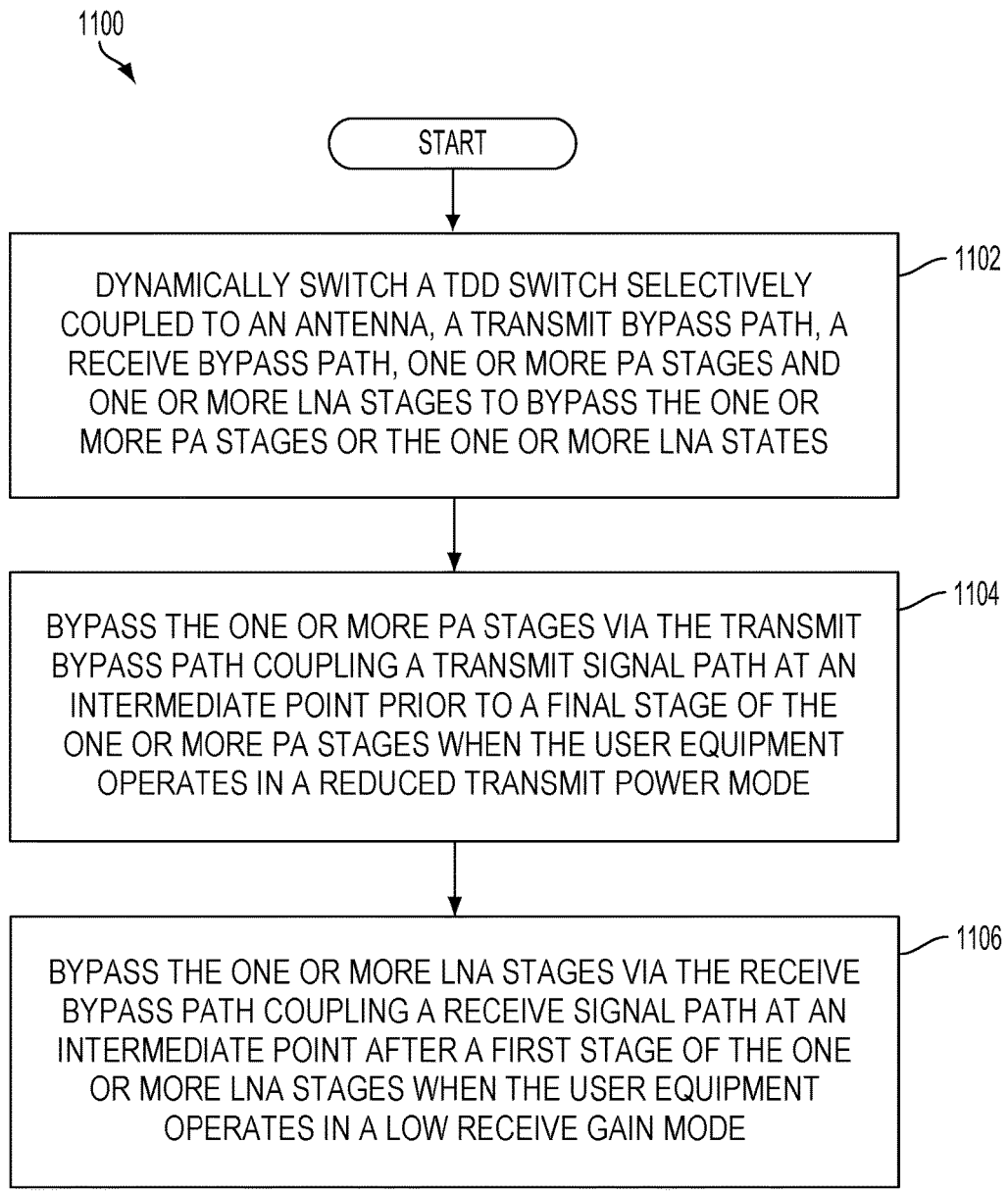
FIG. 11 depicts a simplified flowchart of a method for achieving switch gain in transmit and receive paths according to one aspect of the disclosure.

FIG. 11 depicts a simplified flowchart of a method 1100 for bypassing a power amplifier and a low noise amplifier according to one aspect of the disclosure. At block 1102, a time division duplex (TDD) switch (of a user equipment (UE)) selectively coupled to an antenna, a bypass path, one or more power amplifier stages (a first power amplifier stage and a second power amplifier stage) and one or more low noise amplifier stages dynamically switches to bypass the one or more low noise amplifier stages or the one or more power amplifier stages. At block 1104, the one or more power amplifier stages are bypassed via the transmit (TX) bypass path coupling a transmit signal path at an intermediate point prior to a final stage of the one or more power amplifier stages in a reduced transmit power mode. At block 1106, the one or more low noise amplifier stages are bypassed via the receive (RX) bypass path coupling a receive signal path at an intermediate point after a first stage of the one or more low noise amplifier stages when the UE operates in a low receive gain mode.

According to one aspect of the present disclosure, a radio frequency front end of a user equipment is described. The radio frequency front end of a user equipment includes means for selectively coupling an antenna to a transmit signal path prior to the one or more power amplifier stages. The radio frequency front end of the user equipment also includes means for coupling the antenna to a receive signal path after the one or more low noise amplifier stages. The transmit signal path coupling means may, for example, comprise a switching device (e.g., switch 316, switch 518, switch 620, switch 726, switch 828 and/or switch 920), a trace and/or connectors. The transmit signal path coupling means or the receive signal path coupling means may, for example, comprise a switching device (e.g., switch 316, switch 518, switch 620, switch 726, switch 828 and/or switch 920), a trace and/or connectors.

FIG. 12 is a block diagram showing an exemplary wireless communication system in which a configuration of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed front end module. It will be recognized that other devices may also include the disclosed front end module, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the RF front end.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A radio frequency front end of a user equipment, comprising:
   a receive chain comprising a first low noise amplifier stage;
   a transmit chain comprising a first power amplifier stage;
   a transmit bypass path selectively coupled by a first switch to a transmit signal path at a first intermediate point of the transmit chain, prior to the first power amplifier stage;
   a receive bypass path selectively coupled by a second switch to a receive signal path at a first intermediate point of the receive chain after the first low noise amplifier stage, a portion of the transmit bypass path selectively shared with the receive bypass path, the second switch differing from the first switch; and a time division duplex switch coupled to an antenna, the transmit bypass path, the receive bypass path, the first power amplifier stage and the first low noise amplifier stage.

2. The radio frequency front end of the user equipment of claim 1, in which the time division duplex switch comprises a single pole triple throw switch.

3. The radio frequency front end of the user equipment of claim 2, in which a first throw of the single pole triple throw switch is coupled to the transmit signal path, a second throw of the single pole triple throw switch is coupled to the receive signal path, a third throw of the single pole triple throw switch is coupled to the transmit bypass path or the receive bypass path, and a pole of the single pole triple throw switch is coupled to the antenna.

4. The radio frequency front end of the user equipment of claim 1, further comprising a third switch within the transmit bypass path to selectively couple to the first intermediate point of the transmit chain to bypass the first power amplifier stage during a transmit bypass mode or a fourth switch within the receive bypass path to selectively couple to the first intermediate point of the receive chain to bypass the first low noise amplifier stage during a receive bypass mode.

5. The radio frequency front end of the user equipment of claim 4, in which the first switch is at the first intermediate point of the transmit chain to bypass the first power amplifier stage and in which the second switch is at the first intermediate point of the receive chain to bypass the first low noise amplifier stage.

6. A method of bypassing a low noise amplifier stage and a power amplifier stage of a radio frequency front end of a user equipment, comprising:
dynamically switching a time division duplex (TDD) switch selectively coupled to an antenna, a transmit bypass path, a receive bypass path, at least one power amplifier stage and at least one low noise amplifier stage to bypass the at least one low noise amplifier stage or the at least one power amplifier stage, the bypassing comprising:
bypassing the at least one power amplifier stage via the transmit bypass path selectively coupled by a first switch to a transmit signal path at an intermediate point prior to a final stage of the at least one power amplifier stage when the user equipment operates in a reduced transmit power mode; and
bypassing the at least one low noise amplifier stage via the receive bypass path selectively coupled by a second switch to a receive signal path at an intermediate point after a first stage of the at least one low noise amplifier stage when the user equipment operates in a low receive gain mode, a portion of the transmit bypass path selectively shared with the receive bypass path, the first switch differing from the second switch.

7. The method of claim 6, in which bypassing the at least one power amplifier stage comprises bypassing the final stage of the at least one power amplifier stage.

8. The method of claim 6, in which bypassing the at least one low noise amplifier stage comprises bypassing the first stage of the at least one low noise amplifier stage.

9. The method of claim 6, further comprising receiving an indication to operate in the reduced transmit power mode based at least in part on a feedback loop.

10. The method of claim 6, in which the user equipment operates in the low receive gain mode when the user equipment receives a signal above a threshold value.

11. A radio frequency front end, comprising:
a receive chain comprising a first low noise amplifier stage;
a transmit chain comprising a first power amplifier stage;
means for selectively coupling an antenna to a transmit signal path via a transmit bypass path at a first intermediate point of the transmit chain, prior to the first power amplifier stage;
means for selectively coupling the antenna to a receive signal path via a receive bypass path at a first intermediate point of the receive chain after the first low noise amplifier stage, a portion of the transmit bypass path selectively shared with the receive bypass path; and
a time division duplex switch coupled to the antenna, the transmit signal path coupling means, the receive signal path coupling means, the first power amplifier stage and the first low noise amplifier stage, in which the time division duplex switch comprises a single pole triple throw switch and comprises a transistor having a gate width shorter than a series transistor in the time division duplex switch.

12. The radio frequency front end of claim 11, in which a first throw of the single pole triple throw switch is coupled to the transmit signal path, a second throw of the single pole triple throw switch is coupled to the receive signal path, a third throw of the single pole triple throw switch is coupled to the transmit bypass path or the receive bypass path, and a pole of the single pole triple throw switch is coupled to the antenna.

13. The radio frequency front end of claim 11, in which the transmit signal path coupling means is selectively coupled to the first intermediate point of the transmit chain to bypass the first power amplifier stage during a transmit bypass mode or the receive signal path coupling means is selectively coupled to the first intermediate point of the receive chain to bypass the first low noise amplifier stage during a receive bypass mode.

14. A radio frequency front end of a user equipment, comprising:
a receive chain comprising a first low noise amplifier stage;
a transmit chain comprising a first power amplifier stage;
a transmit bypass path selectively coupled to a transmit signal path at a first intermediate point of the transmit chain, prior to the first power amplifier stage;
a receive bypass path selectively coupled to a receive signal path at a first intermediate point of the receive chain after the first low noise amplifier stage; and
a time division duplex switch coupled to an antenna, the transmit bypass path, the receive bypass path, the first power amplifier stage and the first low noise amplifier stage, the time division duplex switch including a transistor having a gate width shorter than a series transistor in the time division duplex switch.

15. A radio frequency front end of a user equipment, comprising:
a receive chain comprising a first low noise amplifier stage;
a transmit chain comprising a first power amplifier stage;
a transmit bypass path selectively coupled to a transmit signal path at a first intermediate point of the transmit chain, prior to the first power amplifier stage;
a receive bypass path selectively coupled to a receive signal path at a first intermediate point of the receive chain after the first low noise amplifier stage; and
a time division duplex switch coupled to an antenna, the transmit bypass path, the receive bypass path, the first power amplifier stage and the first low noise amplifier stage, the time division duplex switch including multiple series transistors placed sequentially to increase a breakdown voltage of the time division duplex switch or including an impedance inverter to change a first transistor coupled to an antenna port of the time division duplex switch from a series transistor to a shunt transistor.

16. A radio frequency front end of a user equipment, comprising:
   a receive chain comprising a first low noise amplifier stage;
   a transmit chain comprising a first power amplifier stage;
   a transmit bypass path selectively coupled to a transmit signal path at a first intermediate point of the transmit chain, prior to the first power amplifier stage;
   a receive bypass path selectively coupled to a receive signal path at a first intermediate point of the receive chain after the first low noise amplifier stage, a portion of the transmit bypass path selectively shared with the receive bypass path;
   a time division duplex switch coupled to an antenna, the transmit bypass path, the receive bypass path, the first power amplifier stage and the first low noise amplifier stage; and
   a first switch within the transmit bypass path to selectively couple to the first intermediate point of the transmit chain to bypass the first power amplifier stage during a transmit bypass mode, and/or within the receive bypass path to selectively couple to the first intermediate point of the receive chain to bypass the first low noise amplifier stage during a receive bypass mode,
   wherein the first switch is further configured to selectively couple to a second intermediate point of the transmit chain to bypass the first power amplifier stage and a second power amplifier stage of the transmit chain during a transmit bypass mode and/or further configured to selectively couple to a second intermediate point of the receive chain to bypass the first low noise amplifier stage and a second low noise amplifier stage of the receive chain during a receive bypass mode.

17. A radio frequency front end of a user equipment, comprising:
   a receive chain comprising a first low noise amplifier stage;
   a transmit chain comprising a first power amplifier stage;
   a transmit bypass path selectively coupled to a transmit signal path at a first intermediate point of the transmit chain, prior to the first power amplifier stage;
   a receive bypass path selectively coupled to a receive signal path at a first intermediate point of the receive chain after the first low noise amplifier stage, a portion of the transmit bypass path selectively shared with the receive bypass path;
   a time division duplex switch coupled to an antenna, the transmit bypass path, the receive bypass path, the first power amplifier stage and the first low noise amplifier stage;
   a first switch within the transmit bypass path to selectively couple to the first intermediate point of the transmit chain to bypass the first power amplifier stage during a transmit bypass mode, and/or within the receive bypass path to selectively couple to the first intermediate point of the receive chain to bypass the first low noise amplifier stage during a receive bypass mode; and
   a second switch coupled to the first switch, the second switch configured to selectively couple to a second intermediate point of the transmit chain to bypass the first power amplifier stage and a second power amplifier stage during the transmit bypass mode or configured to selectively couple to a second intermediate point of the receive chain to bypass the first low noise amplifier stage and a second low noise amplifier stage during the receive bypass mode.

18. The radio frequency front end of the user equipment of claim 17, further comprising an auxiliary channel tapped to at least one of the time division duplex switch, the first switch and the second switch.

* * * * *